(12) United States Patent
Niimi et al.

(10) Patent No.: US 9,572,240 B2
(45) Date of Patent: Feb. 14, 2017

(54) LIGHT SOURCE APPARATUS

(71) Applicant: USHIO DENKI KABUSHIKI KAISHA, Tokyo (JP)

(72) Inventors: Gota Niimi, Tokyo (JP); Hironobu Yabuta, Tokyo (JP)

(73) Assignee: USHIO DENKI KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/107,824

(22) PCT Filed: Dec. 12, 2014

(86) PCT No.: PCT/JP2014/006223
§ 371 (c)(1),
(2) Date: Jun. 23, 2016

(87) PCT Pub. No.: WO2015/098031
PCT Pub. Date: Jul. 2, 2015

(65) Prior Publication Data
US 2016/0330826 A1    Nov. 10, 2016

(30) Foreign Application Priority Data

Dec. 25, 2013  (JP) ................................. 2013-266669

(51) Int. Cl.
*H05G 2/00* (2006.01)
*F21V 14/04* (2006.01)
(Continued)

(52) U.S. Cl.
CPC ............... *H05G 2/003* (2013.01); *F21V 14/04* (2013.01); *H01J 37/16* (2013.01); *H01J 37/3244* (2013.01);
(Continued)

(58) Field of Classification Search
USPC ............................... 250/493.1, 503.1, 504 R
See application file for complete search history.

(56) References Cited

U.S. PATENT DOCUMENTS 6,359,969 B1    3/2002 Shmaenok
6,954,266 B2    10/2005 Tomie
(Continued)

FOREIGN PATENT DOCUMENTS

JP    2002-504746 A    2/2002
JP    2004-214656 A    7/2004
(Continued)

OTHER PUBLICATIONS

International Search Report issued in PCT/JP2014/006223; mailed Mar. 24, 2015.
(Continued)

*Primary Examiner* — Nicole Ippolito
*Assistant Examiner* — Hanway Chang
(74) *Attorney, Agent, or Firm* — Studebaker & Brackett PC

(57) ABSTRACT

Disclosed herein a light source apparatus that is capable of suppressing a light transmission rate of a debris trap to be lowered and a reflection rate in a light condenser mirror to be lowered. In the light source apparatus, a shielding member is provided having an aperture is provided in front of a stationary type foil trap to limit a solid angle of light emitted from a high temperature plasma. Furthermore, the stationary type foil trap is provided with a driving mechanism to allow the foil trap to be revolved such that an adhesion part of the debris of the foil trap is deviated from a position of the foil trap facing the aperture.

18 Claims, 23 Drawing Sheets

(51) Int. Cl.
*H01J 37/16* (2006.01)
*H01J 37/32* (2006.01)

(52) U.S. Cl.
CPC ........... *H01J 37/3266* (2013.01); *H05G 2/008* (2013.01); *H01J 2237/022* (2013.01); *H01J 2237/026* (2013.01); *H01J 2237/028* (2013.01)

(56) References Cited

U.S. PATENT DOCUMENTS

| | | |
|---|---|---|
| 7,247,866 B2 | 7/2007 | Bakker et al. |
| 7,427,766 B2 | 9/2008 | Jonkers et al. |
| 7,737,425 B2 | 6/2010 | Bakker et al. |
| 8,129,702 B2 | 3/2012 | Bakker et al. |
| 8,736,806 B2 | 5/2014 | Frijns et al. |

FOREIGN PATENT DOCUMENTS

| | | |
|---|---|---|
| JP | 3728495 B2 | 12/2005 |
| JP | 2007-505460 A | 3/2007 |
| JP | 2010232150 A | 10/2010 |
| JP | 2011187875 A | 9/2011 |
| JP | 2012-513653 A | 6/2012 |
| JP | 2013187098 A | 9/2013 |
| WO | 2009/144609 A1 | 12/2009 |

OTHER PUBLICATIONS

Written Opinion issued in PCT/JP2014/006223; mailed Mar. 24, 2015.

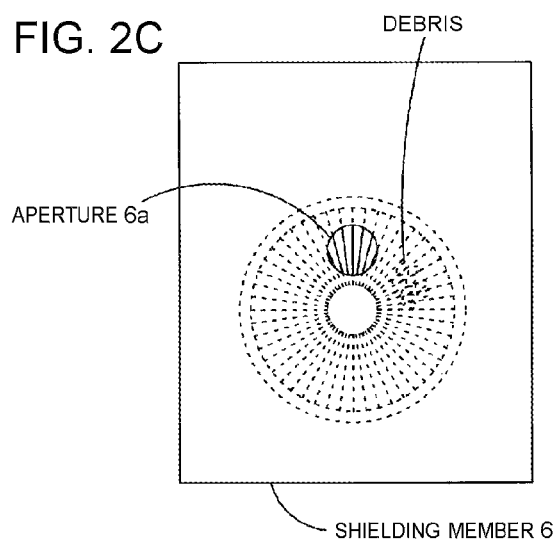
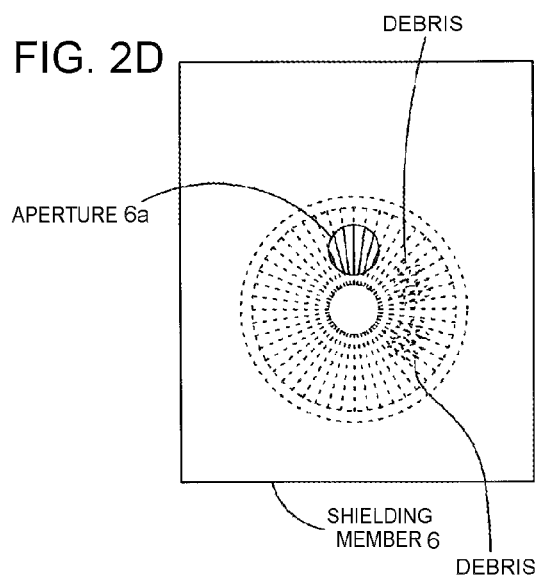

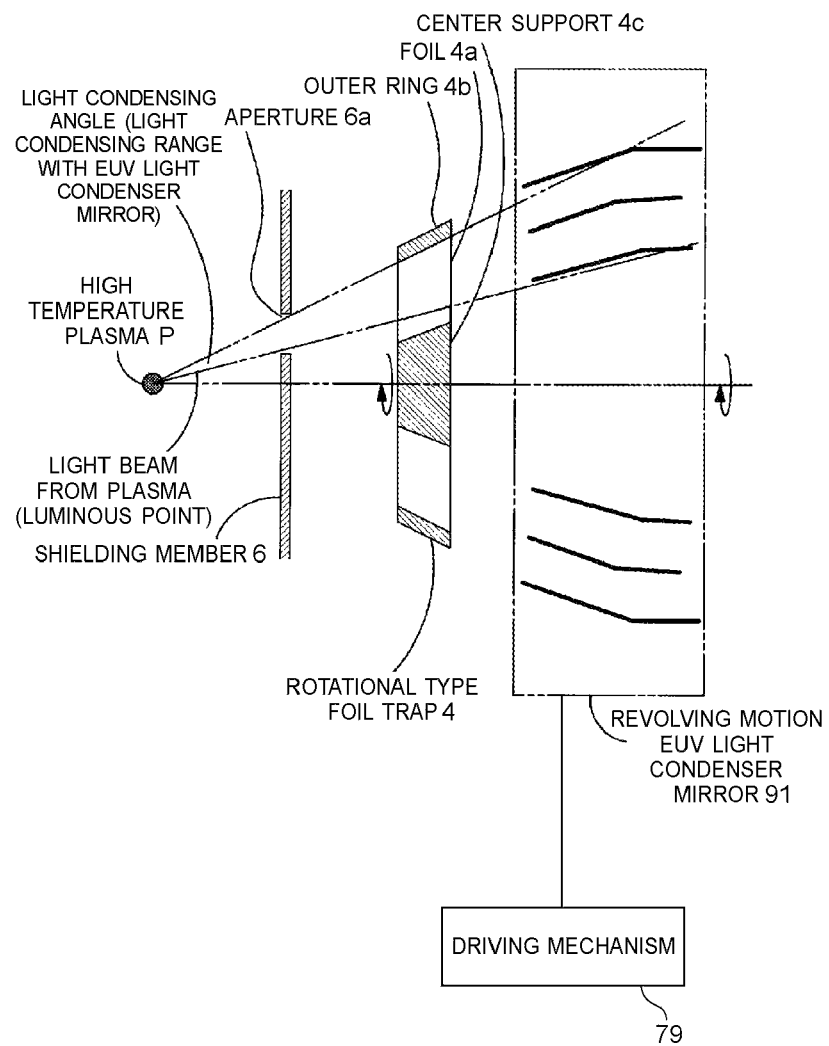

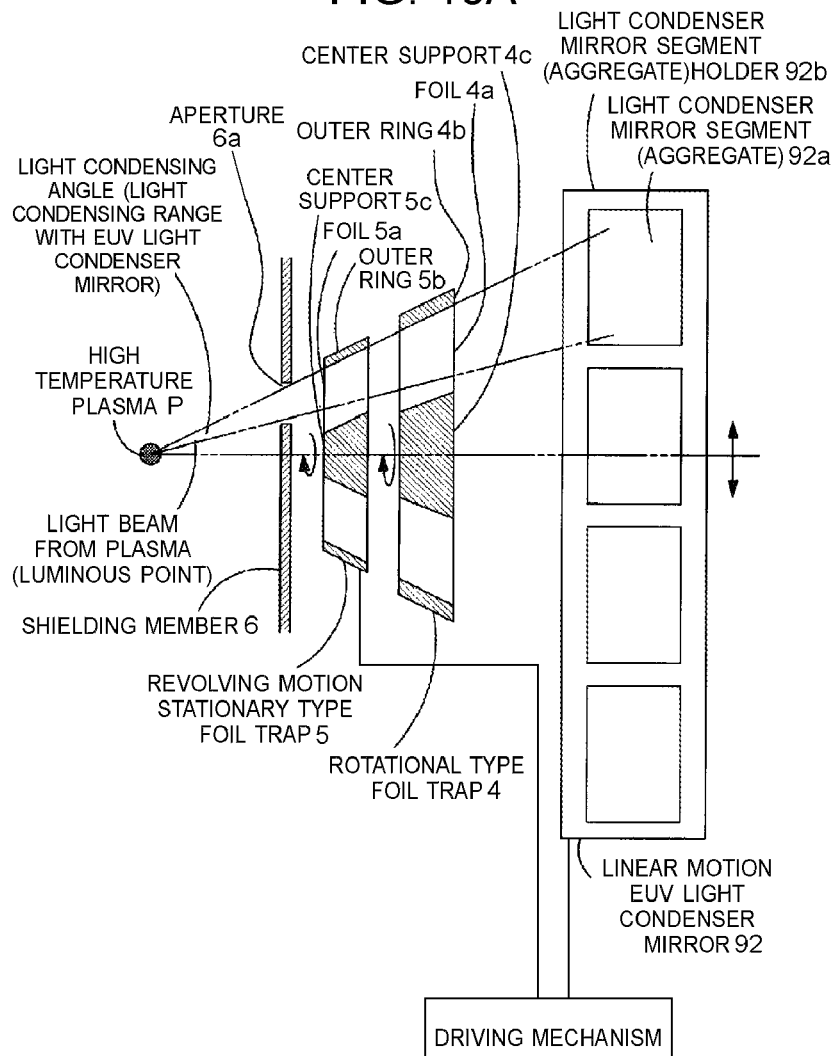

LIGHT SOURCE APPARATUS

FIELD OF THE INVENTION

The present invention relates to a light source apparatus provided with a foil trap that is capable of protecting an optical element or the like from a debris emitted from a high temperature plasma as a light source.

DESCRIPTION OF THE RELATED ART

As a semiconductor integrated circuit is being miniaturized and highly integrated, a projection exposure device, which is used for manufacturing the semiconductor integrated circuit, is demanded to improve the resolving (resolution) power thereof. In order to meet such demand, the wavelength of a light source for the exposure (lithographic exposure) becomes shorter and shorter. As a next generation of a light source for exposing the semiconductor integrated circuit, which succeeds an excimer laser light source apparatus, an extreme ultra violet light source apparatus for emitting Extreme Ultra Violet light (hereinafter also referred to as "EUV light", or simply referred to as "EUV") having the wavelength from 13 nm to 14 nm, particularly the wavelength of 13.5 nm (hereinafter also referred to as "EUV light source apparatus") has been under development.

However, there is no transparent (or transmissive) optical material so far available with respect to the EUV having the wavelength of 13.5 nm. For this reason, an exposure optical system using the EUV is necessarily a reflecting projection type optical system. As a mask to be used for this type of optical system, a reflection type mask has been developed in which an absorber pattern made of a material capable of absorbing the EUV on a mask blank. The mask blank is formed with a multi-layer film for reflecting the EUV light, and the multi-layer film is formed by laminating molybdenum (Mo) film and silicon (Si) film alternately on a low thermal expansion glass substrate. In this type of reflection type mask, once a fine particle or a pit exists on the substrate (i.e., the low thermal expansion glass substrate) constituting the mask blank, or otherwise a fine particle intervenes within the multi-layer film (for example, Mo/Si film), then it leads to a phase defect (phase imperfection).

For this reason, in order to accomplish the EUV lithographic exposure with a high degree of accuracy, a defect-free (zero defect) reflection type mask, which serves as an original plate for the lithographic exposure, is of great importance. Thus, to achieve the highly accurate EUV exposure requires a mask inspection technique with a high degree of accuracy as well.

When a deep ultra violet light (Deep UV: DUV) is used as an inspection light for inspecting the mask blank, the DUV is capable of detecting a surface state of the mask blank. On the contrary, however, it is difficult for the DUV to detect the defect existing inside the multi-layer film or in the substrate on a bottom face of the multi-layer film.

On the other hand, when an extreme ultraviolet light (EUV) is used as the inspection light for inspecting the mask blank, the EUV is capable of detecting the EUV scattering (scattered) light from the defect inside the multi-layer film or from the substrate defect. In other words, the mask blank inspection of the reflection type mask for the EUV exposure is an actinic inspection that uses the exposure light (EUV) for the inspection light.

For this reason, the EUV light source apparatus may be used as the light source for inspecting the mask blank as well.

As one of the inspection system of the mask blank, as disclosed in, for example, Japanese Patent No. 3728495B (Patent Literature 1) an Actinic Blank Inspection (ABI) system has been proposed that employs a dark field of view optical system and collects to detect the EUV scattering (scattered) light from the mask by use of the Schwarzchild optical system.

Several methods for generating the EUV light have been known in relation to the EUV light source apparatus. Amongst them, one method is known that heats and excites an extreme ultra violet light emitting species (hereinafter referred to as "EUV emitting species") to generate the high temperature plasma, and extracts the EUV light from the high temperature plasma.

The EUV light source apparatuses employing the above kind of method generally fall into a Laser Produced Plasma (hereinafter referred to as "LPP") type EUV light source apparatus and a Discharge Produced Plasma (hereinafter referred to as "DPP") type EUV light source apparatus.

(DPP Type EUV Light Source Apparatus)

In the DPP type EUV light source apparatus, for example, a discharge vessel in which electrodes are disposed inside is filled with a gaseous high temperature plasma raw material atmosphere to allow the discharge to occur between the electrodes within the atmosphere to generate an initial plasma.

At this stage, the above mentioned initial plasma contracts by way of an action of the self-magnetic field of a current flowing between the electrodes due to the discharge. With the initial plasma contracting, the initial plasma becomes to have a higher density, and resultantly the plasma temperature rapidly increases. Hereinafter, this kind of action is referred to as "pinch effect". Applying the heat due to the pinch effect, an ion density of the plasma with elevated temperature reaches approximately $10^{17}$ to $10^{20}$ cm$^{-3}$, and an electron temperature reaches approximately 20 to 30 eV. The EUV light is irradiated from the high temperature plasma.

FIG. 12 illustrates the DPP type EUV light source apparatus disclosed in Japanese Translation of PCT International Application Publication No. 2007-505460A (Patent Literature 2) in a simplified manner.

The EUV light source apparatus disclosed has a chamber 1 as a discharge vessel. The chamber 1 is provided with a discharge unit 1a and an EUV light condensing unit 1b. The discharge unit 1a accommodates a pair of discharge electrodes 2a and 2b and the like of a disk shape. The EUV light condensing unit 1b accommodates a foil trap 5, and an EUV light condenser mirror 9, which serves as light condensing optical means, and the like.

A gas exhausting unit 1c exhausts the discharge unit 1a and the EUV light condensing unit 1b in order to keep inside the chamber 1 in a vacuum state.

Reference signs 2a and 2b denote electrodes of the disk shape, respectively. The electrodes 2a and 2b are located apart from each other by a predetermined distance. The electrodes 2a and 2b rotate around rotary shafts 16c and 16d, which serve as rotation axes, respectively, with rotary motors 16a and 16b being rotated.

A reference sign 14 denotes a high temperature plasma raw material which emits the EUV light having the wavelength of 13.5 nm. The high temperature plasma raw material 14 is a heated and melted (molten) metal, for example, tin (Sn) in a liquid state, and is contained in containers 15a and 15b.

The above mentioned electrodes 2a and 2b are arranged such that the electrodes 2a and 2b are partially immersed in the containers 15a and 15b containing the high temperature plasma raw material 14, respectively. The high temperature plasma raw material 14 in the liquid state, which is mounted on surfaces of the electrodes 2a and 2b, respectively, is transported into a discharge space, with the electrodes 2a and 2b being rotated. A laser source 17a irradiates, with laser light 17, the high temperature plasma raw material 14 transported into the above mentioned discharge space. The high temperature plasma raw material 14 irradiated with the laser light 17 is then evaporated.

After the pulse voltage is applied to the electrodes 2a and 2b from a power supply unit 3, the high temperature plasma raw material 14 is evaporated by the irradiation with the laser light 17. Accordingly, a pulse discharge starts between the both electrodes 2a and 2b so that a plasma P is formed from the high temperature plasma raw material 14. When the plasma is heated and excited by a large current (high current) flowing at the time of the discharge and then the plasma is raised up to the high temperature, the EUV light is emitted from the high temperature plasma P.

The EUV light emitted from the high temperature plasma P is condensed (or collected) at a light condensing point (or focusing point, also referred to as "intermediate focusing point") f of a light condenser mirror 9 by an EUV light condenser mirror 9, exits (is emitted) from an EUV light extracting unit 8, and then enters (is incident) into an exposure device 40 connected to the EUV light source apparatus, which is shown in a dashed line in FIG. 12.

The above mentioned EUV light condenser mirror 9 is a condenser mirror of an oblique incidence (grazing) type, and has in general a structure in which a plurality of thin concave mirrors are arranged to be nested with a high degree of accuracy. The particular shape of a reflecting plane of each of the concave mirrors may be, for example, an ellipsoid of revolution shape, a paraboloid of revolution shape, or a Walter type shape, and each of the concave mirrors has a solid of revolution (rotary body) shape. Here, the Walter type shape means a concave shape in which the light incident place (surface) thereof comprises, in turn from the light incident side, a hyperboloid of revolution and an ellipsoid of revolution, or otherwise the hyperboloid of revolution and a paraboloid of revolution.

The EUV light condenser mirror 9 is provided with a plurality of concave mirrors of the solid of revolution (rotary body) shape, each of which has the reflecting plane of particular shape of either ellipsoid of revolution shape or the Walter type shape or the like and has a diameter different from one another. Those concave mirrors constituting the EUV light condenser mirror 9 are arranged by overlapping rotational center axes of the concave mirrors on the same axis such that the focal positions of the concave mirrors substantially coincide with one another. With the concave mirrors being arranged to be nested with a higher degree of accuracy in this way, the EUV light condenser mirror 9 is configured to be capable of satisfactorily reflecting the EUV light having the oblique incident angle of 0 degrees to 25 degrees and also condensing the EUV light at one point.

The EUV light source apparatus of the DPP type shown in FIG. 12 irradiates tin (Sn) or lithium (Li) in a solid or liquid state, which is supplied on a surface of the electrodes in which the discharge occurs, with an energy beam such as a laser or the like to allow the tin or the lithium to evaporate, and subsequently generates the high temperature plasma with the discharge. Thus, the above mentioned method is hereinafter also referred to as a "Laser Assisted Gas Discharge Produced Plasma" (LDP) method.

(LPP Type EUV Light Source Apparatus)

In the LPP type EUV light source apparatus, the plasma is generated by irradiating a target with a driver laser for producing the plasma. As the target material serving as the high temperature plasma raw material for generating the EUV light, lithium (Li) and tin (Sn) have been drawing the attention, similarly to the LDP method.

FIG. 13 illustrates the LPP type EUV light source apparatus in a simplified manner.

The EUV light source apparatus of the LPP type has a light source chamber 1. The light source chamber 1 is provided with a raw material supply unit 10, which supplies a raw material as the EUV emitting species (that is, the high temperature plasma raw material), and a raw material supply nozzle 20. The raw material supply nozzle 20 injects, for example, tin (Sn) in the droplet as the raw material.

Inside the light source chamber 1 is maintained in a vacuum state by a gas exhausting unit 1c, which is constituted with a vacuum pump or the like.

The laser light (or laser beam) 22, which is emitted from an excitation laser light generating device 21 serving as a laser beam irradiating means, is introduced into the light source chamber 1 through a laser light incidence window 23 while being condensed by a laser light condensing unit 24, then passes through a laser light transmitting window (passage hole) 25 provided approximately in a center part of the EUV light condenser mirror 9, and then irradiates the raw material injected from the raw material supply nozzle 20 (for example, tin in the droplet). The excitation laser light generating device 21, which is employed here, may be a pulse laser device having a cyclic (repetitive) frequency of several kHz, and a carbon dioxide gas ($CO_2$) laser or a YAG laser may be employed.

The raw material supplied from the raw material supply nozzle 20 is heated, excited and then becomes the high temperature plasma by irradiation with the laser light 22. The high temperature plasma emits the EUV light. The emitted EUV light is reflected by an EUV condenser mirror 9 towards an EUV light extracting unit 8, condensed (collected) at a light condensing point (focusing point) (also referred to as "intermediate focusing point") of the EUV light condenser mirror 9, exits (is emitted) from an EUV light extracting unit 8, and then enters (is incident) into an exposure device 40 connected to the EUV light source apparatus, which is shown in a dashed line in FIG. 13.

Here, the EUV light condenser mirror 9 may be a reflection mirror having a spherical shape which is coated with, for example, a multi-layer film of molybdenum and silicon. The laser light transmitting window (hole) 25 may not be required depending on the arrangement of the excitation laser light generating device 21 and the laser light incidence window 23.

In some cases, the laser light 22 for generating the high temperature plasma may reach to, as stray light, the EUV light extracting unit 8. For this reason, a spectral purity filter, which is not illustrated in the figures, may be additionally arranged in front of the EUV light extracting unit 8 (that is, the high temperature plasma side). The spectral purity filter allows the EUV light to pass through but prevents the laser light 22 from transmitting.

(Foil Trap)

In the above mentioned various EUV light source apparatuses, various kind of debris is generated from the high temperature plasma P. Such debris may be a debris of metal powder or the like which is generated with metal contacting the high temperature plasma P (for example, a pair of discharge electrodes of the disc shape 2a and 2b) being sputtered by the above mentioned plasma. Alternatively, the debris may be generated due to tin (Sn) as the high temperature plasma raw material 14.

Those kinds of debris acquire large kinetic energy via a contraction and expansion processes of the plasma. In other words, the debris generated from the high temperature plasma P is an ion or a neutral atom that moves (travels) rapidly. The debris causes the reflection rate (reflectivity) of the EUV light to be lowered by butting (colliding against) the EUV light condenser mirror 9 to scrape the reflection plane thereof or by depositing onto the reflection plane thereof.

For this reason, in the EUV light source apparatus, a foil trap 5 is provided between the discharge unit 1a and the EUV light condenser mirror 9, which is accommodated in the EUV light condensing unit 1b, in order to prevent the EUV light condenser mirror 9 from being damaged. The foil trap 5 functions to trap or capture the above mentioned debris and to allow the EUV light only to pass through (transmit).

One example of the foil trap is disclosed in Japanese Translation of PCT International Application Publication No. 2002-504746A (Patent Literature 3), Japanese Translation of PCT International Application Publication No. 2004-214656A (Patent Literature 4), and PCT International Application Publication No. WO2009/144609A (Patent Literature 5). The Patent Literature 4 discloses the "foil-trap".

FIG. 14 shows a schematic configuration of the foil trap as disclosed in the Patent Literature 3 (Japanese Translation of PCT International Application Publication No. 2002-504746A).

The foil trap 5 is configured with a plurality of thin films (foils) or thin flat plates (plates) (hereinafter collectively referred to as "foils" 5a in referring to the thin film or the flat plate), a center support 5c and an outer ring 5b. The foils 5a are radially arranged in the radial direction with a center axis of the foil trap 5 (which is consonant with a light axis of the EUV light in FIG. 14) being a center. The center support 5c supports the plurality of foils 5a and is concentrically arranged with respect to the foils 5a. The outer ring 5c is a support body having a ring shape.

The foils 5a are arranged and supported such that the planar surfaces of the foils 5a are in parallel to the light axis of the EUV light. For this reason, when viewing the foil trap 5 from the extreme ultra violet light source side (i.e., the high temperature plasma P side), the thickness of the foil 5a is solely visible except for a part of the center support 5c and the support body of the outer ring 5b. As a result, the majority of the rays of the EUV light from the high temperature plasma P can pass through (transmit) the foil trap 5.

On the other hand, a plurality of foils 5a of the foil trap 5 functions (performs), by finely dividing the space in which the foils 5a are arranged, to decrease the conductance and also to increase the pressure in a part of the space. For this reason, the speed of the debris from the high temperature plasma P is reduced because the collision probability increases in a region (an area) with increased pressure because of the foil trap 5. Some of the debris with reduced speed is trapped (captured) by the foil or the support body of the foil.

It should be noted that neither the DPP type EUV light source apparatus nor the LDP type EUV light source apparatus uses, for the purpose of the exposure (lithographic exposure), light on the light axis (that is, the light emitted from the high temperature plasma P at the angle of 0 degrees (i.e., emission angle of 0 degrees)). Likewise, neither the DPP type EUV light source apparatus nor the LDP type EUV light source apparatus uses light incident (entered) on the EUV light condenser mirror at the incidence angle less than an incidence angle on which the concave mirror located at the innermost side of the EUV light condenser mirror is capable of reflecting the light (hereinafter also referred to as "minimum incidence angle"). Rather, it is preferable that the above two types of light is eliminated (do not exist). For this reason, in that regard, the presence of the center support 5c causes no problem. Rather, in some cases, the center support 5c is used to positively shield (block out) the light. It should be noted that the center support 5c has in general a cone shape, because the center support 5c is required to have the shape that shields the light with the incidence angle equal to or less than the minimum incidence angle, which is defined by the configuration of the EUV light condenser mirror. Thus, hereinafter the center support is also referred to as "cone".

It should be also noted that the foil trap 5 undergoes the larger thermal load, because the foil trap 5 is arranged adjacent to (in the vicinity of) the high temperature plasma P. Accordingly, the foil 5a or the cone 5c constituting the foil trap 5 is required to be constituted by the high heat resistance material such as molybdenum (Mo) or the like.

(Rotational Type Foil Trap and Stationary Type Foil Trap)

In recent years, as disclosed in Japanese Translation of PCT International Application Publication No. 2012-513653A (Patent Literature 6), certain configuration has been known that is provided with two foil traps in series, one of which is capable of being rotated.

FIG. 15 illustrates a schematic configuration of such kind of foil traps. In an exemplary configuration shown in FIG. 15, a foil trap 4 closer to the high temperature plasma P has a function to rotate. Hereinafter, one foil trap 4 having a rotational (rotary) function is also referred to as a "rotational type foil trap", and the other foil trap of a stationary type without rotational function is also referred to as a "stationary type foil trap".

The rotational type foil trap 4 has a center support 4c that is coaxially connected to a rotary driving shaft of a rotary driving mechanism, which is not shown in the drawings. When the rotary driving shaft of the rotary driving mechanism rotates, then the above mentioned rotational type foil trap 4 is rotated around the rotary driving shaft of the cone (center support) 4c.

The rotational type foil trap 4 is configured to trap (capture) the debris incoming (flying or drifting) from the plasma, with a plurality of foils 4a being rotated around the rotary driving shaft of the center support 4c. For example, the debris due to tin (Sn), which is the high temperature plasma raw material 14, is trapped (captured) by the foils 4a of the rotational type foil trap 4, or otherwise is deflected such that the debris moves in the travelling direction different from the EUV light condenser mirror side. In other words, to use the rotational type foil trap 4 can prevent the debris from depositing on the respective concave mirrors of the EUV light condenser mirror 9 to some extent.

The stationary type foil trap 5 traps (captures) the debris that advances rapidly, which could not have been fully trapped by the rotational type foil trap 4. Because the collision probability of the above mentioned debris increases by the stationary type foil trap 5 in the area with an increased pressure, the speed (velocity) of the debris moving rapidly is reduced. Some of the debris with reduced speed may be trapped by the foils 5a or the support body of the foils. In other words, to use the stationary type foil trap 5 can prevent the respective concave mirrors of the EUV light condenser mirror 9 from being sputtered due to the high speed debris.

The above mentioned foil trap is mostly employed for the DPP type EUV light source apparatus and also the LDP type EUV light source apparatus. On the other hand, in the case of the LPP type EUV light source apparatus, the travelling direction of the debris is controlled by controlling the magnetic field to suppress the collision of the debris against the EUV light condenser mirror, or otherwise the debris adhered to the EUV light condenser mirror is removed by a cleaning gas such as hydrogen gas or the like. However, as shown in FIG. 13, in some cases the above mentioned foil trap 5 may be arranged between the high temperature plasma P and the EUV light condenser mirror 9. In other words, the above mentioned foil trap may be employed not only in the DPP type EUV light source apparatus and the LDP type EUV light source apparatus but also in the LPP type EUV light source apparatus.

LISTING OF REFERENCES

Patent Literatures

Patent Literature 1: Japanese Patent 3728495B
Patent Literature 2: Japanese Translation of PCT International Application Publication No. 2007-505460A
Patent Literature 3: Japanese Translation of PCT International Application Publication No. 2002-504746A
Patent Literature 4: Japanese Laid open Publication of Patent Application No. 2004-214656A
Patent Literature 5: PCT International Publication No. WO2009/144609A
Patent Literature 6: Japanese Translation of PCT International Application Publication No. 2012-513653A

SUMMARY OF THE INVENTION

Problems to be Solved by the Invention

When the EUV light source apparatus is used as the light source for inspecting the mask blank, similarly to the case in which the above mentioned EUV light source apparatus is used for the lithographic exposure, the EUV light is required to be supplied to the mask blank inspection apparatus in a steady manner over a long time of period. Hereinafter, "supply in a steady manner" or "steady supply" means that the EUV light is supplied in a state in which the degradation and variation of the EUV light source output over time is suppressed.

As already described above, the mask blank inspection apparatus detects the scattered (scattering) light from the mask blank by irradiating the mask blank with the EUV light. For this reason, in order to reduce the measurement deviation (error), it is preferable that the output degradation or variation of the EUV light output supplied from the EUV light source is minimal as far as possible.

One of the reason why the EUV light output emitted from the EUV light source is deteriorated is that the EUV light transmission rate (transmissivity) is reduced in the foil trap or the EUV light condenser mirror both of which constitute the debris trap.

As already described above, the debris due to tin (Sn) generated from the high temperature plasma P acquires large kinetic energy through the contraction and expansion processes of the plasma. Such kind of debris due to Sn is an ion or a neutral atom travelling at high speed (rapidly), which collides against the foils of the foil trap before reaching to the EUV light condenser mirror, and a part of which adheres to and deposits onto the foils of the above mentioned foil trap. For this reason, a part of a gap between the respective foils of the foil trap becomes narrower. As a result, the EUV light transmission rate with respect to the foil trap is reduced.

In addition, the foil trap arranged to be facing (opposing) the high temperature plasma (e.g., the rotational type foil trap 4 in the example shown in FIG. 15) is heated by the high temperature plasma P. Furthermore, the foil trap is also heated with the above mentioned debris colliding against the foil trap. In this way, the foil trap undergoes a higher thermal load. For this reason, apart of the foils constituting the foil trap is deformed, and the EUV light transmission rate with respect to the foil trap is reduced along with the foil being deformed.

In the meantime, it has been known that a high melting point material constituting the foils such as molybdenum or the like becomes brittle as the recrystallization advances when the high melting point material reaches at the temperature equal to or greater than the recrystallizing temperature. Depending on the degree of the above mentioned thermal load, in some cases, the temperature of the foils constituting the foil trap at least partially reaches equal to or greater than the recrystallization temperature, the recrystallization of the foils advances so that the foils become brittle and likely to be damaged.

On the other hand, in some cases, a part of the above mentioned debris (i.e., a Sn ion or a neutral Sn atom travelling at high speed) incidentally happens to reach to the EUV light condenser mirror without being trapped by the foil trap.

Out of fast (high speed) particles reaching to the EUV light condenser mirror, in some cases, the neutral atom of Sn incidentally happens to adhere to and deposit onto the reflecting plane (surface) of the EUV light condenser mirror. In a part (region) onto which the Sn neutral atom adheres to deposit, the irradiated EUV light is absorbed and the EUV light reflection hardly occurs.

Likewise, out of fast particles reaching to the EUV light condenser mirror, in some cases, the fast ion of Sn incidentally happens to scrape a part of the reflecting plane of the EUV light condenser mirror. In a region of the EUV light condenser mirror in which the reflecting material is scraped to be dispersed or damaged, light reflection of the EUV light irradiated never occurs.

The present invention has been made in view of the above mentioned circumstances and its first object is to provide a light source apparatus that is capable of suppressing the light transmission rate of the light in the debris trap due to the debris to be lowered.

A second object of the present invention is to provide a light source apparatus that is capable of suppressing the light reflection rate of the EUV light condenser mirror to be lowered, which is caused because the debris emitted from the high temperature plasma due to the high temperature plasma raw material travels at high speed and reaches to the light condensing mirror.

Solution to the Problem

In certain types of light source apparatuses in which a substantially small irradiation area of a workpiece is irradiated with the light from the light source, such as the EUV light source apparatus for inspecting the mask blank or the like, the etendue of the light emitted from the light source apparatus (i.e., a product of the magnitude of the high temperature plasma P and a solid angle of the light extraction (takeoff) from the plasma) is permissible to be small. In light of the above conception, according to one aspect of the present invention, there is provided a light source apparatus in which a shielding member having an aperture for reducing the solid angle of the light emitted from the high temperature plasma (i.e., an aperture member) is arranged between a debris trap (foil trap) and the high temperature plasma P. Also, the aperture member may be configured with a high heat resistance material.

With this configuration, the light that has passed through (transmitted) the aperture of the above mentioned shielding member is irradiated onto a part of an aperture of the stationary type foil trap at a side of the high temperature plasma. Thus, it makes it possible to reduce an amount of debris (Sn) adheres to and deposits onto the foils of the foil trap constituting the debris trap, and also to suppress the thermal deformation of the foils to be generated due to the heat input from the high temperature plasma P.

Furthermore, according to another aspect of the present invention, a driving mechanism configured to drive the foil trap constituting the debris trap may be provided. The driving mechanism is configured to drive the foil trap such that the debris adhering (adhesion) portion (part) of the debris trap is deviated from a position of the foil trap facing the above mentioned aperture of the shielding member. With this configuration, it makes it possible to allow the above mentioned aperture of the shielding member to face a region on the foil trap that is without the debris adhering or otherwise with a relatively small degree of debris adhesion. As a result, it makes it possible to suppress the degradation (deterioration) of the light transmission rate of the foil trap.

Furthermore, according to another aspect 6 of the present invention, another driving mechanism may be provided for the light condenser mirror configured to condense the light emitted from the high temperature plasma P. The driving mechanism may be configured to drive the light condenser mirror such that the debris adhering (adhesion) portion (part) of the light condenser mirror is deviated from a position of the light condenser mirror facing the above mentioned aperture of the shielding member. With this configuration, it makes it possible to reduce the degradation (deterioration) of the light transmission rate of the light condenser mirror. As a result, it makes it possible for the light source apparatus as a whole to reduce the degradation (deterioration) of the light transmission rate due to the adhesion of the debris or the like so that the light source apparatus is capable of outputting the light in a stable manner over a long time of period.

With the above mentioned conception being considered, according to one aspect of the present invention, the above mentioned problem is to be solved as follows.

(1) There is provided a light source apparatus comprising a vessel; a debris trap configured to trap at least a part of debris from a plasma, the plasma emitting light and being generated in the vessel; a light condenser mirror arranged at a light emitting side of the debris traps. The light source apparatus further comprises a shielding member arranged between the plasma and the debris trap, the shielding member having an aperture that restricts (limits) a solid angle of the emitted light such that an irradiation area of the light emitted from the plasma becomes smaller than an aperture of the debris trap at a side of the plasma. The above mentioned debris trap is provided with a driving mechanism configured to drive the debris trap such that a part (portion) of the debris trap to which the debris adheres is deviated from a position of the debris trap facing the above mentioned aperture.

(2) According to another aspect of the present invention, the above mentioned debris trap may comprise a plurality of foils extending radially; and at least one foil trap configured to allow the light to pass through but to trap the debris from the plasma, and a driving motion to drive the foil trap may be a revolving motion.

(3) According to yet another aspect of the present invention, the above mentioned debris trap may comprise a plurality of foils arranged substantially in parallel at a predetermined intervals; and at least one foil trap configured to allow the light to pass through but trap the debris from the plasma, and a driving motion to drive the foil trap may be a linear motion.

(4) According to yet another aspect of the present invention, the above mentioned light condenser mirror may be provided with a driving mechanism configured to drive the light condenser mirror such that a part (portion) of the light condenser mirror to which the debris adheres is deviated from a position of the light condenser mirror facing the above mentioned aperture.

(5) According to yet another aspect of the present invention, the above mentioned light condenser mirror may be an oblique incidence type light condenser mirror that has a structure in which a plurality of concave mirrors each having a rotary body (solid revolution) shape are arranged to be nested, and a driving motion to drive the light condenser mirror may be a rotational (rotative) motion.

(6) According to yet another aspect of the present invention, the above mentioned light condenser mirror may have a structure in which a plurality of light condenser mirror segment assemblies (aggregates) are arranged in series, each of the light condenser mirror segment assemblies being configured by cutting out a plurality of segments each including a region reflecting the EUV from an oblique incidence type light condenser mirror that has a structure in which a plurality of concave mirrors each having a rotary body (solid revolution) are arranged to be nested, and a driving motion to drive the EUV light condenser mirror may be a linear motion.

(7) According to yet another aspect of the present invention, the above mentioned shielding member may be made of molybdenum or tungsten.

Advantageous Effect of the Invention

According to the present embodiments of the present invention, the following advantageous effect is attainable.

(1) According to one embodiment of the present embodiments of the present invention, shielding member having an aperture that limits (restricts) a solid angle of light emitted from a plasma are arranged between the plasma and a debris trap. As a result, it makes it possible to reduce an amount of debris adhering to and depositing onto foils of a foil traps and to suppress the generation of the thermal deformation of the foils due to input heat from the high temperature plasma.

Yet furthermore, the debris trap is driven (actuated) such that a debris adhering part (portion) of the debris trap is deviated from a position of the debris trap facing the aperture of the shielding member. As a result, it makes it possible to suppress the light transmission rate in the foil trap to be lowered (or recover the light transmission rate from being lowered) due to the debris adhering to the debris trap. Resultantly, it makes it possible to make a useful life duration of the foil trap be longer and to accomplish a light output in a stable manner over a long time of period.

In particular, it makes it possible to suppress the light transmission rate to be lowered (deteriorated) (or recover the light transmission rate from being lowered) in the foil trap due to the debris adhering while maintaining a pressure inside the chamber to be in a lower pressure state (for example, vacuum state). Therefore, it is possible to accomplish the substantially same action (effect) as the foil trap being exchanged. Resultantly, it makes it possible to significantly reduce the down time of the light source apparatus associated with a conventionally necessitated exchange operation of the foil trap.

(2) According to another embodiment of the present embodiments of the present invention, a driving mechanism configured to drive the light condenser mirror is provided for the light condensing mirror condensing the light from the plasma such that a part (portion) of the light condenser mirror to which the debris adheres is deviated from a position of the light condenser mirror facing the aperture of the shielding member. As a result, it makes it possible to suppress the light transmission rate to be lowered (deteriorated) (or recover the light transmission rate from being lowered) in the light condenser mirror due to the debris adhesion (adhering). Resultantly, it makes it possible to make a useful life duration of the light condenser mirror be longer and to accomplish a light output in a stable manner over a long time of period.

In particular, it makes it possible to suppress the light transmission rate to be lowered (deteriorated) (or recover the light transmission rate from being lowered) in the foil trap due to the debris adhering while maintaining a pressure inside the chamber to be in a lower pressure state (e.g., vacuum state). Therefore, it is possible to accomplish the substantially same action (effect) as the light condenser mirror being exchanged. Resultantly, it makes it possible to significantly reduce the down time of the light source apparatus associated with a conventionally necessitated exchange operation of the light condenser mirror.

(3) According to yet another embodiment of the present embodiments of the present invention, the shielding member is formed from a high heat resistance material such as molybdenum or tungsten or the like. As a result, it makes it possible to reduce (minimize) the shielding member to be deteriorated, which is arranged closer to the high temperature plasma and undergoes a large thermal load. Also, with the shielding member being configured with a conductive metal, it makes it possible to allow the shielding member to be at the same electrical potential as the debris trap and the chamber so as to prevent the unintentional discharge inside the chamber from being generated.

The above mentioned and other not explicitly mentioned objects, aspects and advantages of the present invention will become apparent to a skilled person from the following detailed description when read and understood in conjunction with the appended claims and drawings.

BRIEF DESCRIPTION OF THE DRAWINGS

FIG. 2C is a view schematically showing an exemplary configuration according to a revolving motion stationary type foil trap observed through an aperture provided in a shielding member in the light source apparatus shown in FIG. 1A;

FIG. 2D is a view schematically showing an exemplary configuration according to a revolving motion stationary type foil trap observed through an aperture provided in a shielding member in the light source apparatus shown in FIG. 1A;

FIG. 7A is a view schematically showing an exemplary configuration according to a fifth embodiment of the present invention in which a revolving motion EUV light condenser mirror is employed;

FIG. 10A is a view schematically showing an exemplary configuration according to a seventh embodiment of the present invention in which a linear motion EUV light condenser mirror is employed;

DETAILED DESCRIPTION OF THE INVENTION

Hereinafter, referring to the accompanying drawings, the present invention will be described in detail in an exemplary embodiment in which the present invention is applied to an EUV light source apparatus for inspecting a mask blank.

First Embodiment

Figure 1A:
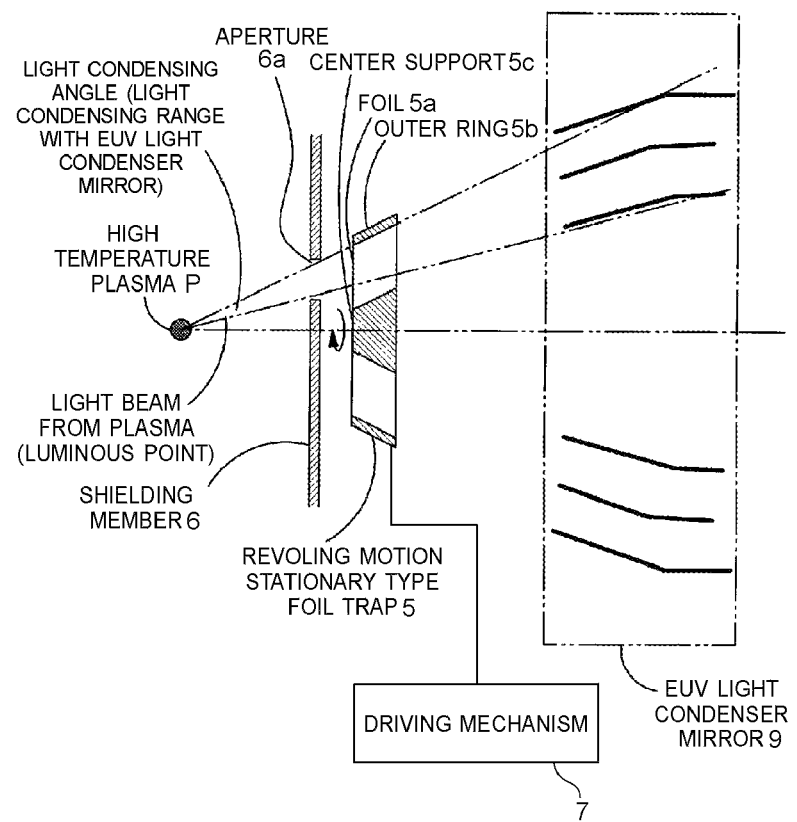
FIG. 1A is a view schematically showing an exemplary configuration according to a first embodiment of a light source apparatus of the present invention.
Figure 1B:
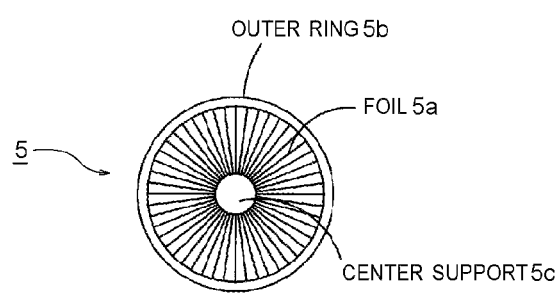
FIG. 1B is a view schematically showing an exemplary configuration according to a first embodiment of a light source apparatus of the present invention.

FIGS. 1A and 1C are views showing an exemplary configuration of an EUV light source apparatus for inspecting a mask blank according to a first embodiment of the present invention. More particularly, FIG. 1A is a sectional view (i.e., a sectional view along a light axis of the EUV light) showing an exemplary arrangement of a shielding member 6, a revolving motion stationary type foil trap 5, and an EUV light condenser mirror 9 in the light source apparatus of the present embodiment. FIG. 1B is a view showing the revolving motion stationary type foil trap 5 observed from the above mentioned shielding member 6 side. As shown in FIG. 1A, a shielding member 6 having an aperture 6a is arranged between a high temperature plasma P and the revolving motion stationary type foil trap 5 shown in FIG. 1B, which will be described in detail below. At a subsequent stage of the revolving motion stationary type foil trap 5, an EUV light condenser mirror configured to condense (collect) the EUV light is provided.

Generally in a case of the EUV light source apparatus used for exposure (lithographic exposure) light source, the EUV light emitted from the EUV light source apparatus is irradiated onto a relatively large irradiation area (region) on a workpiece (for example, a wafer). For this reason, the etendue of the above mentioned EUV light (i.e., a product of the magnitude of the high temperature plasma P and a solid angle of extraction (takeoff)) of the EUV light form the plasma) is assumed to become larger to some extent.

On the other hand, in a case of an EUV light source apparatus used for a light source for inspecting a mask blank, the EUV light emitted from the EUV light source apparatus is irradiated onto a considerably (fairly) small irradiation area (region) on a workpiece (for example, a mask blank), compared to the EUV light source apparatus used as the exposure light source. For this reason, the etendue of the EUV light emitted from the EUV light source apparatus used as a light source for inspecting the mask blank is permissible to be relatively small. Thus, the EUV irradiating light irradiated onto the mask blank has a higher brightness and a higher sharpness, as the etendue thereof is small.

The EUV light source apparatus for inspecting the mask blank according to the present embodiment has been conceived, focusing an attention to a characteristic feature that the etendue of the EUV light emitted from this type of EUV light source apparatus is permissible to become smaller. The EUV light source apparatus according to the present embodiment is provided with an aperture member (i.e., a shielding member 6) having the aperture 6a arranged between the debris trap (i.e., the stationary type foil trap 5) and the high temperature plasma P. The aperture member (shielding member 6) having the aperture 6a serves to restrict (limit) the solid angle of the EUV light emitted from the high temperature plasma P so as to make the solid angle of the EUV light extracted from the high temperature plasma P smaller. Also, the aperture member (shielding member 6) is configured with a high heat resistant material.

More particularly, a shielding member 6 having the aperture 6a, which is configured to extract the EUV light with the prescribed solid angle, is provided between the high temperature plasma P and the debris trap. The aperture 6a of the shielding member 6 restricts (limits) the solid angle of the light such that the irradiation area (region) of the light emitted from the high temperature plasma P becomes smaller than a size of an aperture of the foil trap 5 at aside of the plasma. With this configuration, the EUV light, which has passed through the aperture 6a of the shielding member 6, is irradiated onto a part of an aperture of the stationary type foil trap at the side of the high temperature plasma P, as shown in FIG. 1A.

In an exemplary configuration shown in FIGS. 1A and 1B, the light source apparatus is provided with a debris trap having a stationary type foil trap 5, and a shielding member 6 having an aperture 6a between the debris trap and the high temperature plasma P.

The shielding member 6 is configured with, for example, a high melting point material such as molybdenum (Mo) or tungsten (W) or the like.

It should be noted that when the difference in potentials occurs between the shielding member 6 and the foil trap 5, then the discharge is generated in between. In this regard, as inside the foil trap 5 has a higher gas pressure in order to prevent the debris, the discharge is in particular more likely to occur inside the foil trap 5. Once the discharge occurs inside the foil trap 5, then the sputtering secondarily and inevitably causes the debris to be generated, which is required to be avoided. In order to avoid this, the shielding member 6 is preferably set to a ground potential. In general, the main body of the debris reduction apparatus and the chamber (vacuum vessel) configured to accommodate those components and the like are grounded and have ground potentials. Thus, with the shielding member 6 being electrically connected to the above mentioned debris reduction apparatus main body and the chamber in which those are accommodated to allow the shielding member 6 to be a ground potential so that those elements are all set to the same potentials and it makes it possible to avoid the discharge occurring between them. For this reason, it is preferable to constitute the shielding member 6 with a conductive material.

Figure 14:
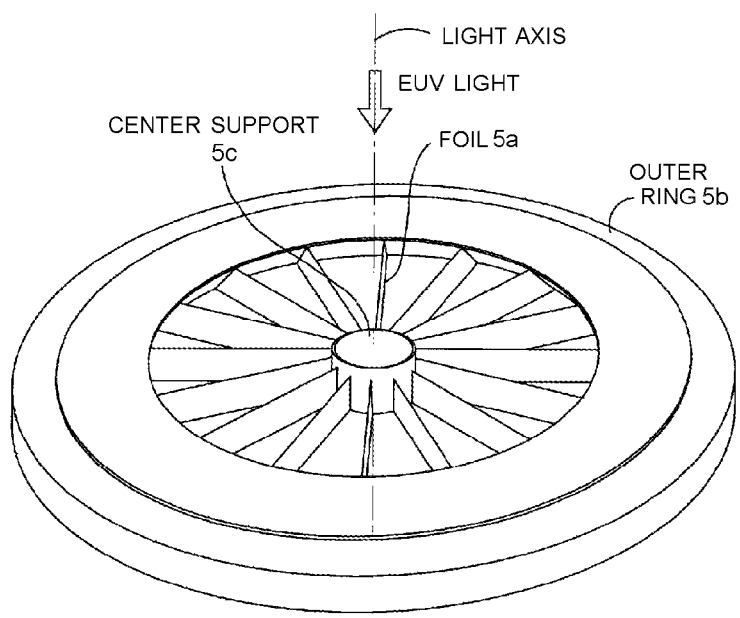
FIG. 14 is a view schematically showing an exemplary configuration of the foil trap.

As shown in FIG. 1B, the stationary type foil trap 5 comprises, similarly to those shown in FIG. 14, a plurality of foils 5 radially arranged in a radial direction, a center support 5c concentrically arranged and configured to support the plurality of foils 5, and an outer ring 5b serving as a ring shaped support body. The stationary type foil trap 5 according to the present invention is configured to be capable of revolving (pivoting), as will be described below.

With the shielding member 6 being arranged as shown in FIGS. 1A and 1B, a fast (high speed) Sn particle due to tin (Sn) emitted from the high temperature plasmas P (i.e., a travelling Sn ion or a travelling neutral Sn atom at high speed) collides against and adheres to the shielding member 6 without being capable of passing through a region of the shielding member 6 except for the aperture 6a. In other words, the shielding member 6 allows the amount of the above mentioned Sn particles entering into the debris trap to be reduced.

Furthermore, because the thermal radiation from the high temperature plasma P does not pass through except through the above mentioned aperture 6a, it makes it possible to suppress the heat input into the debris trap from the high temperature plasma P.

More particularly, the amount of debris (Sn) is reduced that adheres to and deposit onto the foils 5a of the stationary type foil trap 5 constituting the debris trap. Likewise, it is possible to suppress the thermal (heat) deformation of the foils 5a being generated due to the heat input from the high temperature plasma P. For this reason, with the above mentioned shielding member 6 being arranged, it makes it possible to suppress the debris trap to be deformed or deteriorated. As a result, it makes it possible to suppress the EUV transmission rate to be reduced with respect to the debris trap (i.e., foil trap) due to the deformation or deterioration of the debris trap.

It should be noted that, as appropriate, the temperature of the shielding member 6 may be modulated (regulated) by a temperature regulating mechanism, which is not shown in the drawings, such that the temperature of the shielding member 6 is equal to or greater than the melting point of tin (Sn), 230 degrees Celsius, which is a high temperature plasma P raw material. By regulating the temperature in this way, when the debris due to Sn emitted from the high temperature plasma P collides against and adheres to the shielding member 6, the debris (Sn) adhered to the shielding member 6 is liquidized (liquefied) and drops down (falls down) along a surface of the shielding member 6. Thus, it makes it possible to recover (retrieve) Sn emitted as the debris.

In this regard, when the temperature of the shielding member 6 is regulated, it is preferable to regulate the temperature of the shielding member 6 to be equal to or less than the boiling point of Sn. By regulating the temperature in this way, it makes it possible to efficiently avoid the defect that the debris (Sn) adhered to the shielding member 6 vaporizes to reattach to the inner wall of the chamber of the EUV light source apparatus or the constituent elements inside the chamber such as the EUV light condenser mirror or the like.

Yet furthermore, as already mentioned above, the stationary type foil trap 5 constituting the debris trap is configured to be capable of revolving (pivoting). More particularly, the stationary type foil trap 5 according to the present embodiment is provided with a driving mechanism 7. By the driving mechanism 7, the stationary type foil trap 5 revolves around (about) the rotation axis thereof (hereinafter, this type of the stationary type foil trap that is configured to be capable of revolving is referred to as "revolving motion stationary type foil trap").

Figure 15:
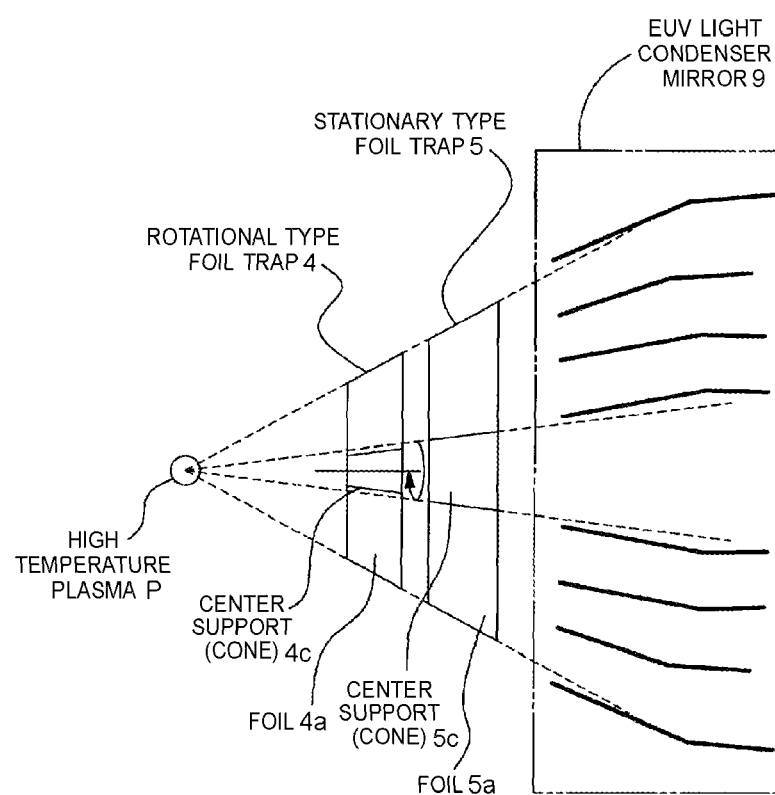
FIG. 15 is a view showing an exemplary configuration in which two foil traps are provided in series and one of the foil traps is configured to be rotated.

It should be noted that the above mentioned rotational type foil trap 4 shown in FIG. 15 is configured to trap (capture) the debris flying (incoming) from the plasma P with the rotational motion (operation) thereof and to rotate at a prescribed rotational speed (velocity) that allows the debris incoming from the plasma to be efficiently trapped.

On the other hand, the revolving motion stationary type foil trap 5, as shown in FIGS. 1A and 1B, revolves such that a part (portion) of the foils to which the debris adheres is deviated from a position of the foils facing the aperture 6a. For example, when the debris has adhered to the foil trap 5 to some extent, then the foil trap 5 is revolved stepwise (in a stepping manner).

It should be noted that, in place of the foil trap 5 being stepwise revolved, the foil trap 5 may be relatively slowly revolved such that the part (portion) of the foils to which the debris adheres is deviated from the position of the foils facing the aperture 6a. In this case, the debris incoming thorough the aperture 6a of the shielding member 6 is dispersed and adheres to the entire foils 5a of the foil trap 5 so as to suppress the light transmission rate to be reduced.

It should be also noted that, in this case, the foil trap 5 is assumed to constantly move. Nevertheless, in order to differentiate from the rotational type foil trap 4, here the revolving foil trap in this way is included to and referred to as the "revolving motion stationary type foil trap".

FIGS. 2A to 2D are views of the revolving motion stationary type foil trap shown in FIG. 1A observed through the aperture 6a of the shielding member 6 in the case of the foil trap 5 being stepwise revolved.

As described above, in the case of the EUV light source apparatus for inspecting the mask blank, as the etendue of the EUV light is permissible to be smaller, it is possible to make the solid angle of the EUV light emitted from the high temperature plasma P smaller.

Figure 2A:
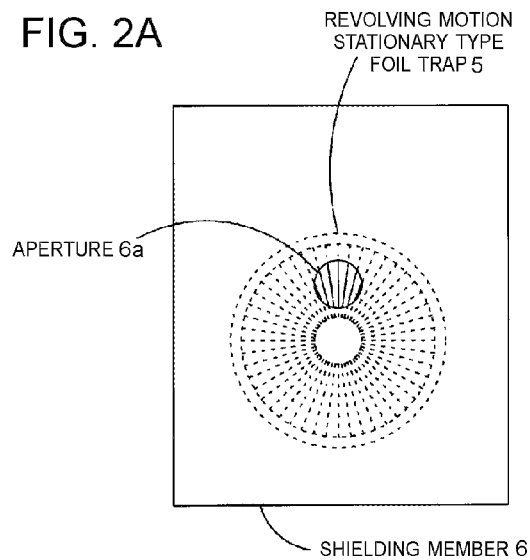
FIG. 2A is a view schematically showing an exemplary configuration according to a revolving motion stationary type foil trap observed through an aperture provided in a shielding member in the light source apparatus shown in FIG. 1A.
Figure 2B:
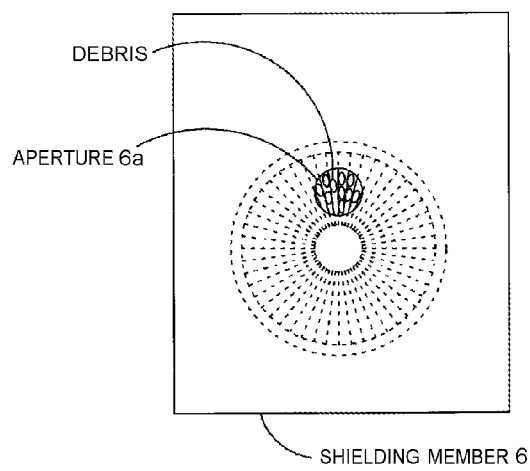
FIG. 2B is a view schematically showing an exemplary configuration according to a revolving motion stationary type foil trap observed through an aperture provided in a shielding member in the light source apparatus shown in FIG. 1A.

For this reason, according to the present embodiment, the shielding member 6 is provided as described above. Thus, as shown in FIG. 2A, the EUV light flux transmits (passes through) a region (area) of a part of the stationary type foil trap 5. Likewise, the debris emitted from the high temperature plasma P (e.g., a Sn ion or a neutral Sn atom moving (travelling) at a high speed) is also assumed to reach to only a part of a region of the stationary type foil trap 5. Thus, even if the debris (Sn) adheres to the stationary type foil trap 5, as shown in FIG. 2B, the region to which Sn adheres is no more than a part of region of the stationary type foil trap 5.

For this reason, by employing the revolving motion stationary type foil trap 5 configured to be capable of revolving, it makes it possible to move (deviate) the region of the revolving motion stationary type foil trap 5 to which the debris adheres from the position of the foil trap 5 facing the aperture 6a of the shielding member 6 to an another position. As shown in FIG. 2C, the revolving motion stationary type foil trap 5 is revolved by a driving mechanism, which is not shown in the drawings, until the above mentioned debris adhering region moves to a position out of view through the aperture from a position facing the aperture 6a of the shielding member 6. Subsequently, the revolving motion stationary type foil trap 5 is fixed by a fixing mechanism, which is not shown in the drawings.

Yet likewise, in the revolving motion stationary type foil trap 5 at a position shown in FIG. 2C, when the debris has adhered to the foil trap 5 to some extent, then as shown in FIG. 2D, the revolving motion stationary type foil trap 5 is revolved by the above mentioned revolving (driving) mechanism to fix by the above mentioned fixing mechanism until the debris adhering region moves to the position that the debris adhering region becomes out of view through the aperture 6a.

In this way, in the EUV light source apparatus capable of being used as the mask blank inspection apparatus, it is permissible to restrict (limit) the solid angle of the EUV light emitted from the high temperature plasma P by the aperture 6a of the shielding member 6. Thus, by employing the revolving motion stationary type foil trap 5 in which the stationary type foil trap 5 is configured to be capable of revolving, the revolving motion stationary type foil trap 5 is being revolved depending on the degree of the debris adhesion to the revolving motion stationary type foil trap 5. Accordingly, it makes it possible to recover the transmission rate of the EUV light from being reduced in the revolving motion stationary type foil trap 5. As a result, it makes it possible to make the useful life duration of the revolving motion stationary type foil trap 5 be longer so that it makes it possible to supply the EUV light to the inspecting optical system side of the inspection apparatus for the mask blank in a stable manner for a long time of period.

In this regard, it is possible to carry out the above mentioned revolving motion (operation) of the revolving motion stationary type foil trap 5 while maintaining the pressure inside the chamber to be in a lower pressure state (vacuum state). In other words, it is possible to substantially accomplish the similar (same) action (effect) as exchanging the stationary type foil trap 5 to anew one to which no debris adheres without causing the vacuum break. For this reason, it makes it possible to significantly reduce the down time of the EUV light source apparatus associated with the conventionally necessitated exchange of the stationary type foil trap 5, compared to the conventional light source apparatus.

Second Embodiment

As described above, according to the first embodiment of the EUV light source apparatus to be used as the light source for the mask blank inspection of the present invention, the shielding member having the aperture is arranged between the high temperature plasma and the debris trap (i.e., the stationary type foil trap), and further the revolving motion stationary type foil trap is employed in which the stationary type foil trap comprising a plurality of foils radially extending from the main shaft (center support) is configured to be capable of revolving.

Nevertheless, the conceivable configuration of the stationary type foil trap is not limited to the above mentioned first embodiment. A second embodiment, which will be described below, is a modification to the stationary type foil trap according to the first embodiment.

Figure 3A:
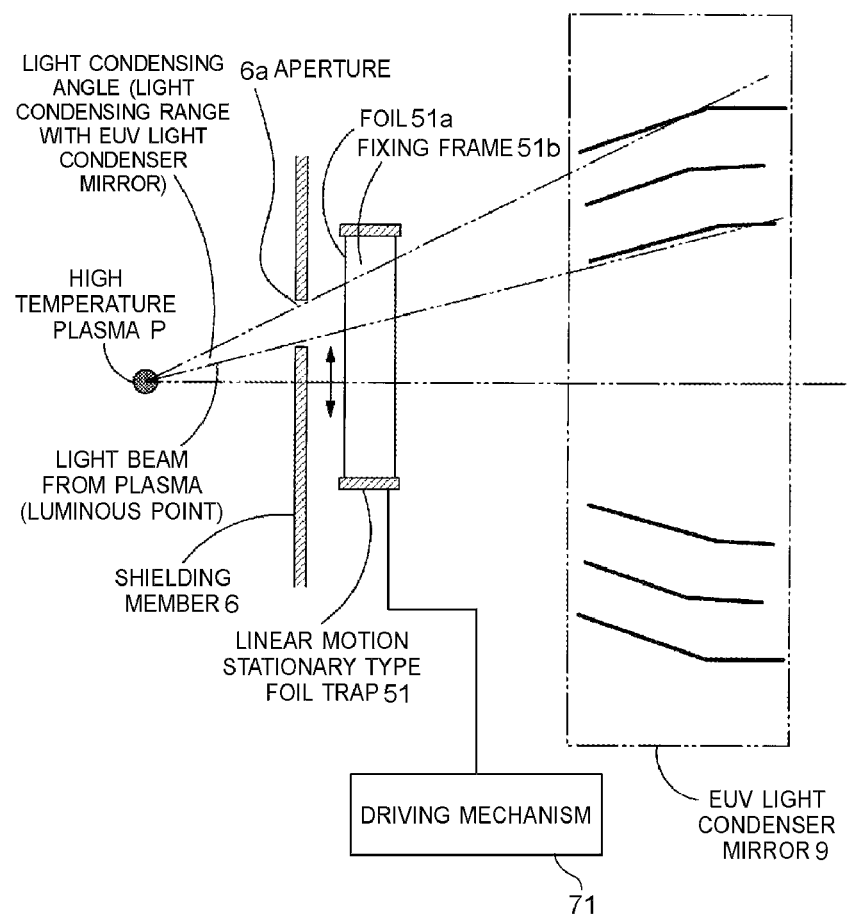
FIG. 3A is a view schematically showing an exemplary configuration according to a second embodiment of the present invention using a linear motion stationary type foil trap.
Figure 3B:
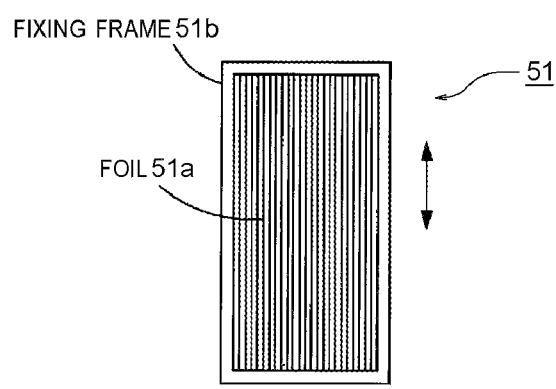
FIG. 3B is a view schematically showing an exemplary configuration according to a second embodiment of the present invention using a linear motion stationary type foil trap.

FIGS. 3A and 3B show a second embodiment of the present invention. More particularly, FIG. 3A is a sectional view (i.e., sectional view along the light axis of the EUV light) showing an exemplary arrangement of the shielding member 6, a linear motion stationary type foil trap 51, the EUV light condenser mirror 9 of the light source apparatus according the present embodiment. FIG. 3B shows the stationary type foil trap according to the present embodiment observed from the shielding member 6 side.

As shown in FIG. 3A, according to the present embodiment, the stationary type foil trap 51, which is provided between the shielding member 6 having the aperture 6a and the EUV light condenser mirror 9, is a stationary type foil trap 51 in which, as shown in FIG. 3B, a plurality of foils 51a are arranged substantially in parallel at a predetermined interval (for example, at an equally spaced interval). More particularly, the stationary type foil trap 51 according to the second embodiment employs a configuration in which a plurality of foils 51 a are fixed to an inner side of a rectangular fixing frame 51b such that the plurality of foils 51 are arranged substantially in parallel at a predetermined interval.

Figure 4A:
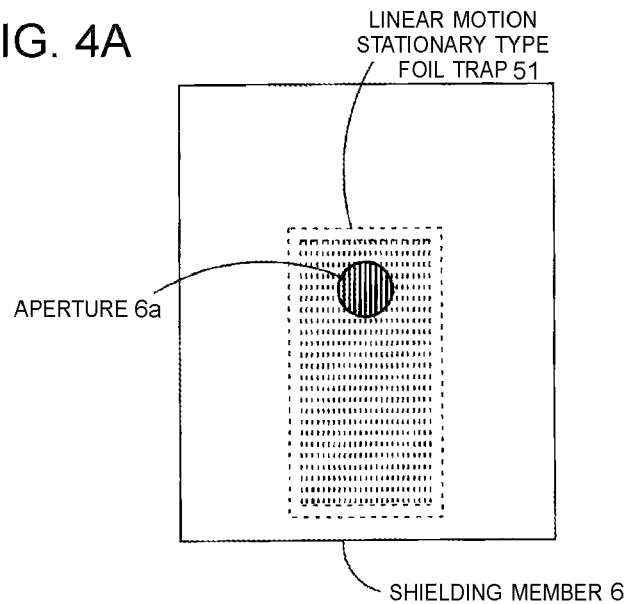
FIG. 4A is a view schematically showing an exemplary configuration according to the linear motion stationary type foil trap observed through an aperture provided in a shielding member in the light source apparatus shown in FIG. 3A.
Figure 4B:
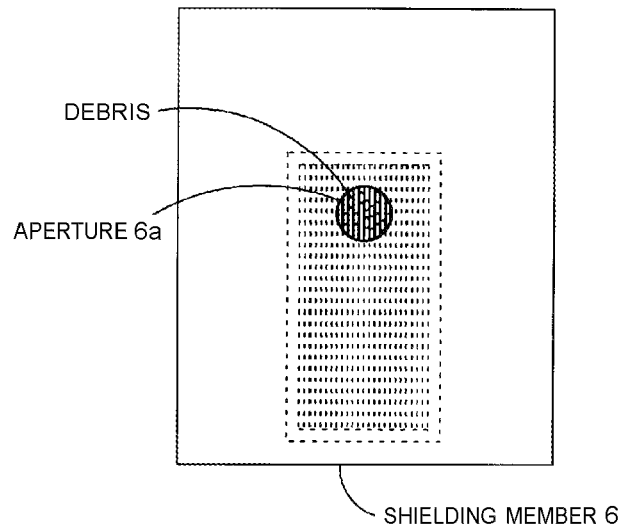
FIG. 4B is a view schematically showing an exemplary configuration according to the linear motion stationary type foil trap observed through an aperture provided in a shielding member in the light source apparatus shown in FIG. 3A.

FIGS. 4A to 4D respectively show the linear motion stationary type foil trap 51 observed through the aperture 6a of the shielding member 6 in the case that the foil trap is moved in a direct linear motion. As mentioned above, in the case of the EUV light source apparatus for inspecting the mask blank, as it is permissible to make the solid angle of the EUV light emitted from the high temperature plasma P be smaller, as shown in FIG. 4A, the EUV light flux is assumed to transmit (pass through) a region of a part of the stationary type foil trap 51 only. Likewise, the debris emitted from the high temperature plasma P (for example, a Sn ion or a neutral Sn atom travelling at a high speed (fast)) is also assumed to reach to only a region of apart of the stationary type foil trap 51. As a result, even if the debris (Sn) adheres to the stationary type foil trap 51, as shown in FIG. 4B, a region to which Sn adheres is no more than a region of a part of the stationary type foil trap 51.

Furthermore, the stationary type foil trap 51 according to the present embodiment is configured to be capable of linearly moving (translating or travelling). More particularly, the stationary type foil trap 51 according to the present invention is provided with a driving mechanism 71, and linearly moves (translates) by the driving mechanism 71 (here, this kind of motion is referred to as a "linear motion", and the stationary type foil trap according to the present invention is also referred to as a "linear motion stationary type foil trap" 51).

Figure 4C:
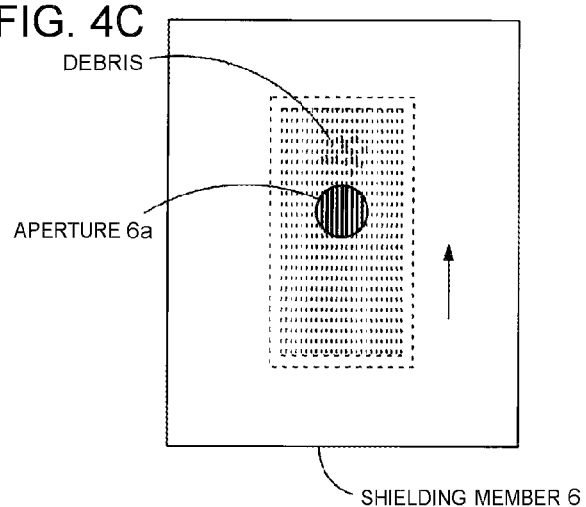
FIG. 4C is a view schematically showing an exemplary configuration according to the linear motion stationary type foil trap observed through an aperture provided in a shielding member in the light source apparatus shown in FIG. 3A.

Then, by employing the linear motion stationary type foil trap 51 in which the stationary type foil trap 51 having a such structure is configured to be capable of linearly moving (translating), it makes it possible to move (translate) the debris adhering region of the linear motion stationary type foil trap 51 from a position of the foil trap facing the aperture 6a of the shielding member 6. In other words, as shown in FIG. 4C, the linear motion stationary type foil trap 51 is linearly moved (translated) by the driving means 71 from a position facing to the aperture 6a of the shielding member 6 until the debris adhering region moves (translates) to a position out of view through the aperture 6a of the shielding member 6. Subsequently, the linear motion stationary type foil trap 51 is fixed by a fixing mechanism, which is not shown in the drawings.

Figure 4D:
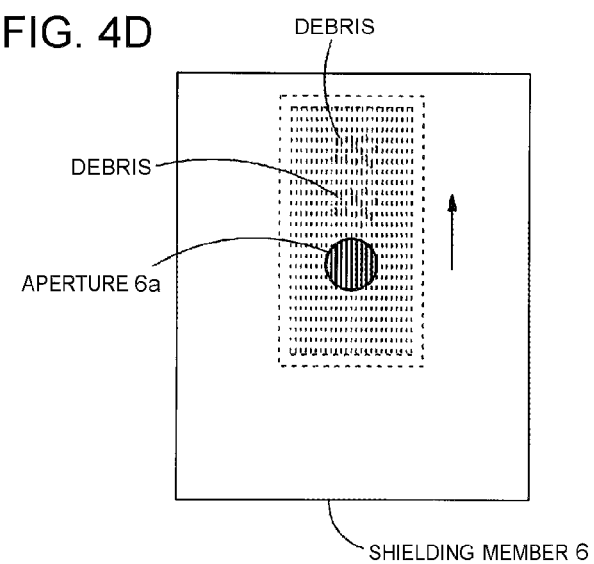
FIG. 4D is a view schematically showing an exemplary configuration according to the linear motion stationary type foil trap observed through an aperture provided in a shielding member in the light source apparatus shown in FIG. 3A.

Likewise, in the linear motion stationary type foil trap 51 at a position shown in FIG. 4C, when the debris has adhered to the foils to some extent, then, as shown in FIG. 4D, the linear motion stationary type foil trap 51 is linearly moved (translated) by the above mentioned driving mechanism 71 until the debris adhering region becomes out of view through the aperture 6a of the shielding member 6, and then fixed by the fixing mechanism.

In other words, by employing the linear motion stationary type foil trap 51 in which the stationary type foil trap, configured by arranging a plurality of foils 51a substantially in parallel at a predetermined interval (for example, an equally spaced interval), is configured to be capable of linearly moving (translating), the linear motion stationary type foil trap 51 is linearly moved (translated) and fixed depending on a degree of debris adhesion to the linear motion stationary type foil trap 51. Thus, it makes it possible to recover the light transmission rate of the EUV light from being reduced due to the debris adhesion in the linear motion stationary type foil trap 51. As a result, it makes it possible to make the useful life duration of the linear motion stationary type foil trap 51 be longer. Also, it makes it possible to supply the EUV light to the inspecting optical system side of the inspection apparatus for the mask blank in a stable manner for a long time of period.

Furthermore, similarly to the first embodiment, it is possible to carry out the above mentioned linear motion and fixing motion (operation) of the linear motion stationary type foil trap 5 while maintaining the pressure inside the chamber to be in a lower pressure state (i.e., vacuum state). Thus, unlike the conventional one, it makes it possible to significantly (drastically) reduce the down time of the EUV light source apparatus associated with the conventionally necessitated exchange of the stationary type foil trap 51.

It should be noted that, in a certain example shown in FIGS. 4A to 4D, a direction, to which each of the foils 51a of the linear motion stationary type foil trap 51 extends, coincides with a linear motion direction of the linear motion stationary type foil trap 51. Nevertheless, both directions are not necessarily required to be coincide with each other. Alternatively, for example, the direction, to which each of the foils 51a of the linear motion stationary type foil trap 51 extends, may be substantially perpendicular to the linear motion direction of the linear motion stationary type foil trap 51.

Furthermore, in the above description, a certain case has been mentioned in which the linear motion stationary type foil trap 51 is moved (translated) stepwise every time the debris adheres to the foil trap 51 to some extent. Nevertheless, alternatively, similarly to the revolving motion stationary type foil trap 5 according to the first embodiment, the linear motion stationary type foil trap 51 may be slowly yet continuously moved (translated) in a linear manner.

Third Embodiment

As described above, according to the embodiment of the present invention exemplarily shown in FIGS. 1A and 1B, the revolving motion stationary type foil trap 5 is provided between the shielding member 6 and the EUV light condenser mirror 9. However, alternatively, the rotational type foil trap 4 may be provided in addition to the revolving motion stationary type foil trap 5.

Figure 5:
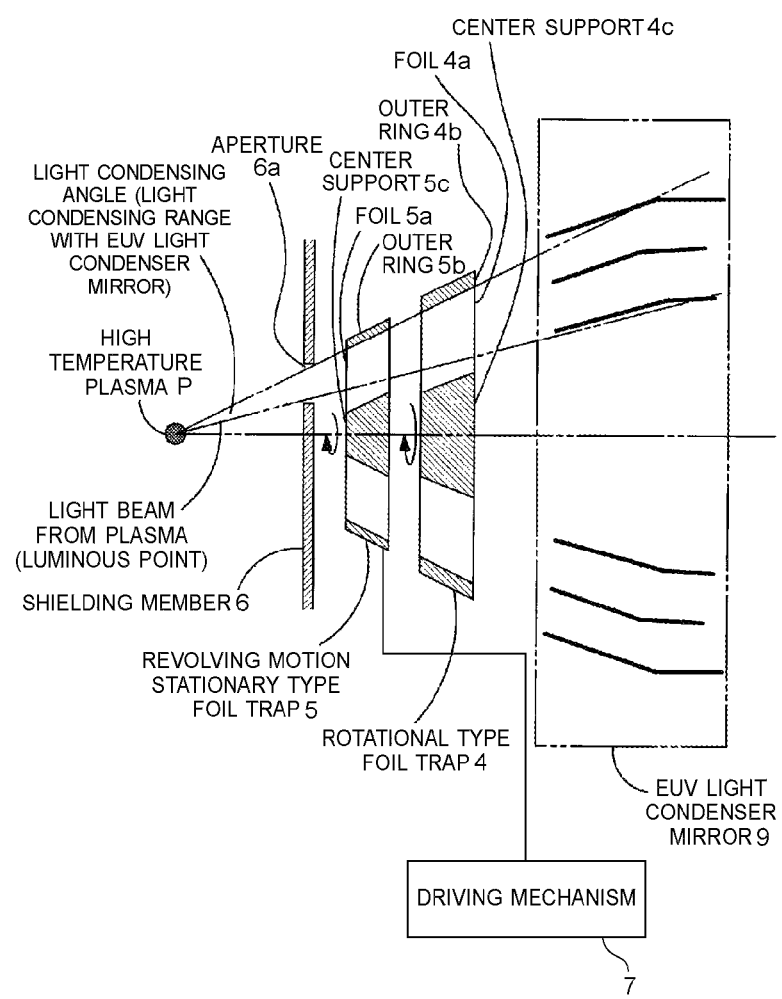
FIG. 5 is a view schematically showing an exemplary configuration according to a third embodiment of the present invention in which the revolving motion stationary type foil trap and a rotational type foil trap are both provided.

FIG. 5 shows an exemplary embodiment in which the revolving motion stationary type foil trap 5 and also the rotational type foil trap 4 are provided between the shielding member 6 and the EUV light condenser mirror 9.

The revolving motion stationary type foil trap 5 comprises, similarly to those shown in FIG. 1B, foils 5a radially arranged in a radial direction; a center support 5c concentrically arranged and configured to support the plurality of foils 5a; and an outer ring 5b serving as a ring shaped support body. The stationary type foil trap 5 is provided with a driving mechanism 7. The stationary type foil trap 5 is revolved by the driving mechanism 7 such that the debris adhering portion (part) is deviated from a position of the foil trap facing the aperture 6a of the shielding member 6.

The debris incoming from the high temperature plasma P through the aperture 6a of the shielding member 6 is, as mentioned above, trapped (captured) by the revolving motion stationary type foil trap 5. In addition, according to the present embodiment, the debris that are not trapped by the revolving motion stationary type foil trap 5 is then trapped or deflected by the rotational type foil trap 4 provided at a subsequent stage.

The rotational type foil trap 4 traps (captures) the debris incoming from the high temperature plasma P, with, as mentioned above, a plurality of foils 4a being rotated about (around) the rotation shaft of the center support 4c. The debris due to Sn as the high temperature plasma raw material is trapped by respective foils 4a of the rotational type foil trap 4, or otherwise deflected such that the travelling (moving) direction becomes different from a direction towards the EUV light condensing mirror 9.

In a manner described above, by providing the revolving motion stationary type foil trap 5 and also the rotational type foil trap 4, it makes it possible to suppress the debris to be deposit onto the respective concave mirrors of the EUV light condenser mirror 9 in more efficient manner.

Yet furthermore, as described above, the revolving motion stationary foil trap 5 is revolved such that the debris adhering part (portion) is deviated from a position of the foil trap 5 facing the aperture 6a of the shielding member 6. Thus, it makes it possible to suppress the light transmission rate of the EUV to be reduced (or recover the light transmission rate from being reduced), and also to make the useful life duration of the foil trap 5 be longer.

In addition, as the rotational type foil trap 4 is constantly being rotated, the debris incoming through the aperture 6a of the shielding member 6 is dispersed and adheres to the entire foils 4a of the foil trap 4 (as a whole). As a result, similarly to the revolving motion stationary type foil trap 5, it makes it possible to suppress the light transmission rate of the EUV light to be suppressed, and also to make the useful life duration of the foil trap 4 be longer.

It should be noted that, although the case in which the revolving motion stationary type foil trap 5 and the rotational type foil trap 4 shown in FIGS. 1A and 1B has been described above, alternatively, the rotational type foil trap 4 may be added to the embodiment in which the linear motion stationary type foil trap 51 is employed shown in FIGS. 3A and 3B.

It should be also noted that, although, in the exemplary configuration shown in FIG. 5, out of the revolving type stationary type foil trap 5 and the rotational type foil trap 4 both constituting the debris trap, the revolving motion stationary type foil trap 5 is configured (arranged) such that the revolving motion stationary type foil trap 5 is facing (opposing to) the high temperature plasma P through the aperture 6a of the shielding member 6, the particular configuration is not limited to the above. Alternatively, for example, the rotational type foil trap 4 may be arranged such that the rotational type foil trap 4 is facing the high temperature plasma P through the aperture 6a of the shielding member 6 instead, and the revolving motion stationary type foil trap 5 may be arranged at the light emitting side of the rotational type foil trap 4.

Yet furthermore, depending on the light intensity of the EUV light, the revolving motion stationary type foil trap 5 may be arranged at both light incidence side and the light emitting side of the rotational type foil trap 4.

It should be also noted that, although, in the above third embodiment, the case in which the rotational type foil trap 4 is provided in addition to the light source apparatus provided with the revolving motion stationary type foil trap 5 shown in FIGS. 1A and 1B, alternatively, the rotational type foil trap 4 may be added to the exemplary configuration in which the linear motion stationary type foil trap 51 is employed as shown in FIGS. 3A and 3B.

Fourth Embodiment

In the above mentioned third embodiment, the case in which the rotational type foil trap 4 is provided in addition to the revolving motion stationary type foil trap 5 has been described above. However, alternatively, as shown in FIG. 6, the debris trap may be configured such that the rotational type foil trap 4 is solely provided between the shielding member 6 and the EVU light condenser mirror 9, provided that the input energy into the high temperature plasma P is relatively small therefore the amount of the debris (Sn) emitted from the high temperature plasma P is also relatively small.

More particularly, because the rotational type foil trap 4 is constantly being rotated, as described above, the debris incoming through the aperture 6a of the shielding member 6 is dispersed and adheres to the entire foils 4a of the foil trap 4 (as a whole). Thus, similarly to the revolving motion stationary type foil trap 5, it makes it possible to suppress the light transmission rate of the EUV light to be reduced.

Figure 6:
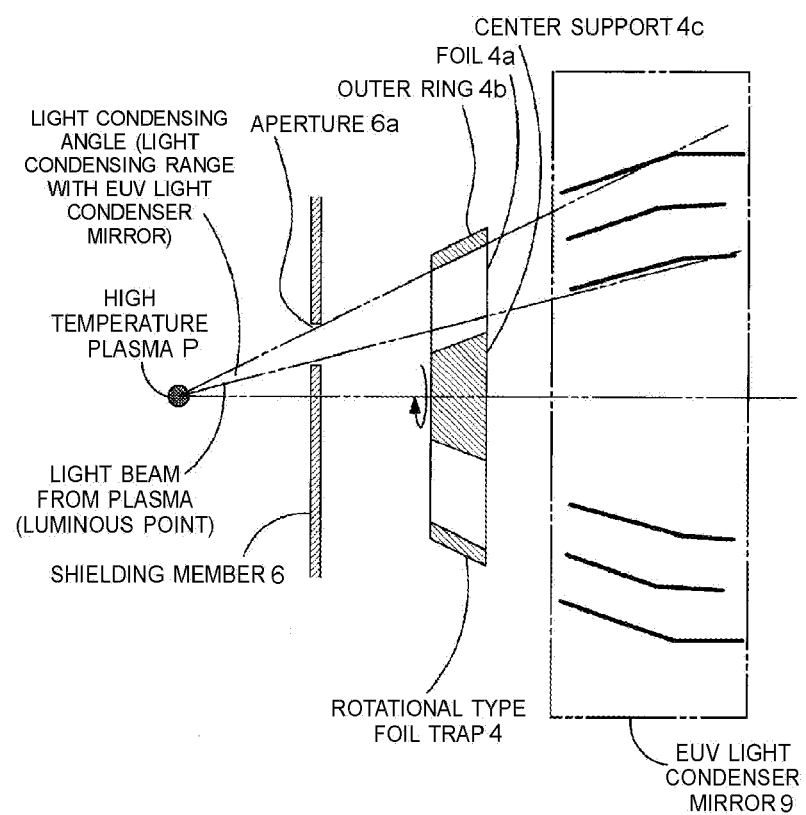
FIG. 6 is a view schematically showing an exemplary configuration according to a fourth embodiment of the present invention in which only the rotational type foil trap is provided.

For this reason, when the amount of debris (Sn) is relatively small, as shown in FIG. 6, even if the rotational type foil trap 4 is solely provided, still it makes it possible to make the useful life duration of the foil trap 4 be longer. Also, it makes it possible to supply the EUV light to the inspecting optical system side of the inspection apparatus for the mask blank in a stable manner for a long time of period.

Fifth Embodiment

In the above mentioned respective embodiments, focusing attention on the characteristic feature that it is permissible for the EUV light source apparatus for the mask blank inspection to make the etendue of the EUV light emitted from the high temperature plasma P be smaller, the aperture member having the aperture, which is provided in order to limit (restrict) the solid angle of the EUV light emitted from the high temperature plasma P and to make the solid angle of the EUV light extracted from the high temperature plasma P be smaller, are arranged between the debris trap and the high temperature plasma, and the aperture member is configured with the high heat resistance material.

With those configuration, the longer useful life duration of the stationary type foil trap 5 and the rotational type foil trap 4 has been achieved, using the fact that the EUV light flux transmits (passes through) a part of region of the debris trap (i.e., the stationary type foil trap 5 or the rotational type foil trap 4) and similarly the debris emitted from the high temperature plasma P (a Sn ion or a neutral Sn atom travelling at a high speed) also reaches only a part of region of the debris trap, owing to the characteristic feature that the solid angle of the EUV light is smaller so that the region to which the debris (Sn) adheres is limited to a part of region of the debris trap. In other words, the debris adhering region of the stationary type foil trap 5 or the rotational type foil trap 4 is allowed to be moved from the position of the foil trap facing the aperture 6a of the shielding member 6, with the stationary type foil trap 5 being revolved or linearly moved (translated) or the rotational type foil trap 4 being used.

Figure 7B:
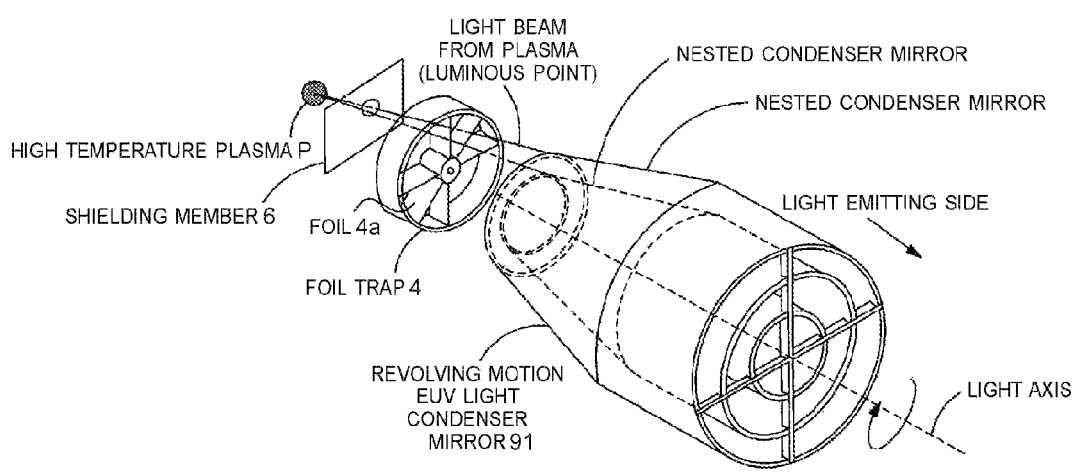
FIG. 7B is a view schematically showing an exemplary configuration according to a fifth embodiment of the present invention in which a revolving motion EUV light condenser mirror is employed.

In the fifth embodiment shown in FIGS. 7A and 7B, similarly to the above mentioned respective embodiments, the shielding member 6 having the aperture 6a is provided. Further, according to the present embodiment, a revolving motion EUV light condenser mirror 91 is employed. FIG. 7A is a cross sectional view (i.e., cross sectional view along the light axis of the EUV light) showing an exemplary arrangement of the shielding member 6, the rotational type foil trap 4, and an EUV light condenser mirror 91 according to the light source apparatus of the present embodiment.

Focusing attention on a characteristic feature that the etendue of the EUV light emitted from the EUV light source apparatus for inspecting the mask blank is permissible to be smaller, according to the fifth embodiment, the fact is leveraged that, by making the solid angle of the EUV light emitted from the high temperature plasma P be smaller, the EUV light reflected by an oblique incidence type EUV light condenser mirror 91 is reflected only on a part of region of the reflecting plane (surface) of the EUV light condenser mirror. The oblique incidence type EUV light condenser mirror 91 has a structure in which a plurality of thin concave mirrors each having a rotary body are arranged to be nested with a high degree of accuracy. Accordingly, it makes it possible to achieve the longer useful life duration of the EUV light condenser mirror 91.

More particularly, according to the fifth embodiment, a revolving motion EUV light condenser mirror 91, in which the EUV light condenser mirror 9 having the above mentioned structure is configured to be capable of revolving, is employed. In other words, the EUV light condenser mirror 91 is provided with a driving mechanism 79, and the EUV light condenser mirror 91 is revolved about the rotational shaft (light axis) thereof by the driving mechanism 79. Further, according to the present embodiment, the above mentioned rotational type foil trap 4 is used as the debris trap.

FIGS. 8A to 8D respectively show the revolving motion EUV light condenser mirror 91 observed from the aperture 6a of the shielding member 6. It should be noted that, in the FIGS. 8A to 8D, the foil trap is omitted on the drawings.

Figure 8A:
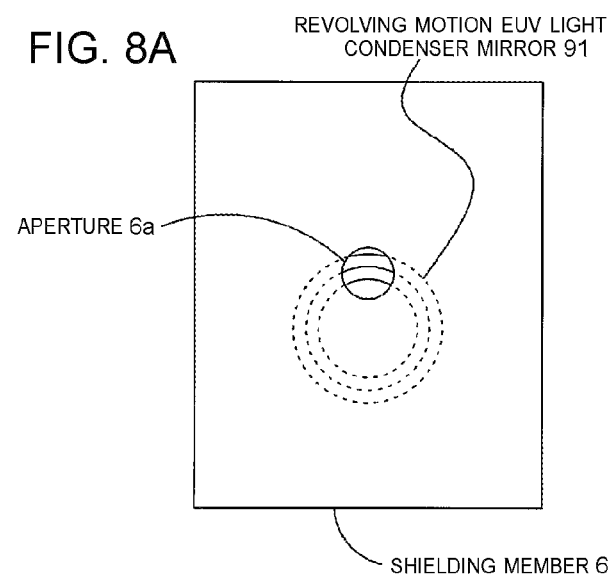
FIG. 8A is a view schematically showing an exemplary configuration according to the revolving motion EUV light condenser mirror observed through an aperture provided in a shielding member in the light source apparatus shown in FIG. 7A.
Figure 8B:
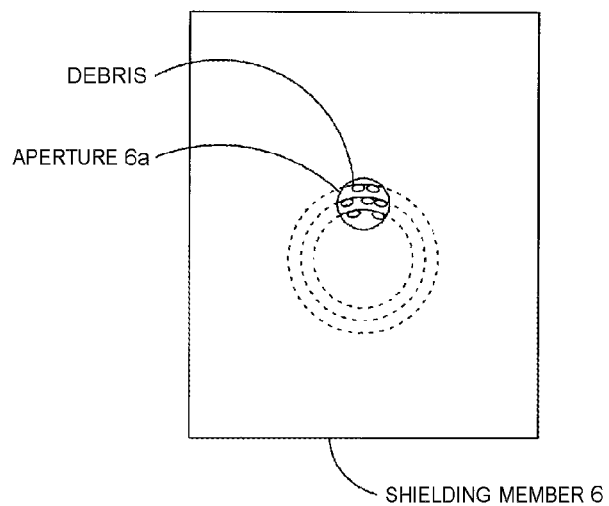
FIG. 8B is a view schematically showing an exemplary configuration according to the revolving motion EUV light condenser mirror observed through an aperture provided in a shielding member in the light source apparatus shown in FIG. 7A.

As apparent from FIG. 8A, the EUV flux, which enters through the aperture 6a of the shielding member 6 and the rotational type foil trap 4, enters (is incident) the revolving motion EUV light condenser mirror 91, and then is reflected on a part of region of the reflecting plane thereof. Likewise, it is assumed that the debris (a Sn ion or a neutral Sn atom travelling at a high speed), which is emitted from the high temperature plasma P, is incoming through the aperture 6a of the shielding member 6 and has not been trapped (escaped from being trapped) by the rotational type foil trap 4, reaches only apart of region of the reflecting plane of the revolving motion EUV light condenser mirror 91. Thus, even if the debris (Sn) adheres to the EUV light condenser mirror 91, as shown in FIG. 8B, the adhering region of Sn is no more than a part of region of the reflecting plane of the revolving motion EUV light condenser mirror 91.

Figure 8C:
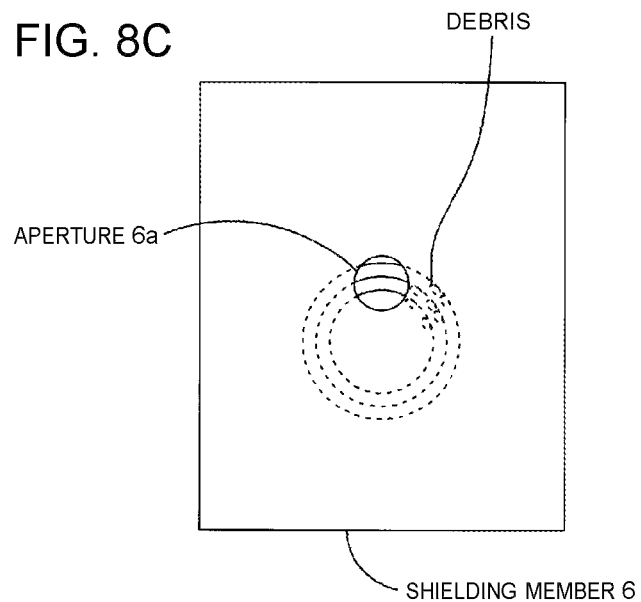
FIG. 8C is a view schematically showing an exemplary configuration according to the revolving motion EUV light condenser mirror observed through an aperture provided in a shielding member in the light source apparatus shown in FIG. 7A.

For this reason, by employing the above mentioned revolving motion EUV light condenser mirror 91, it makes it possible to move the debris adhering region on the reflecting plane of the revolving motion EUV light condenser mirror 91 from a position of the reflecting plane facing the aperture 6a of the shielding member 6. In other words, as shown in FIG. 8C, the revolving motion EUV light condenser mirror 91 is revolved by a revolving mechanism (although not shown, which may be the driving mechanism shown in FIG. 7A) from a position of the reflecting plane facing the aperture 6a of the shielding member 6 until a position that the debris adhering region becomes out of view through the aperture 6a of the shielding member 6. Subsequently, the revolving motion EUV light condenser mirror 91 is fixed by a fixing mechanism, which is not shown in the drawings.

Figure 8D:
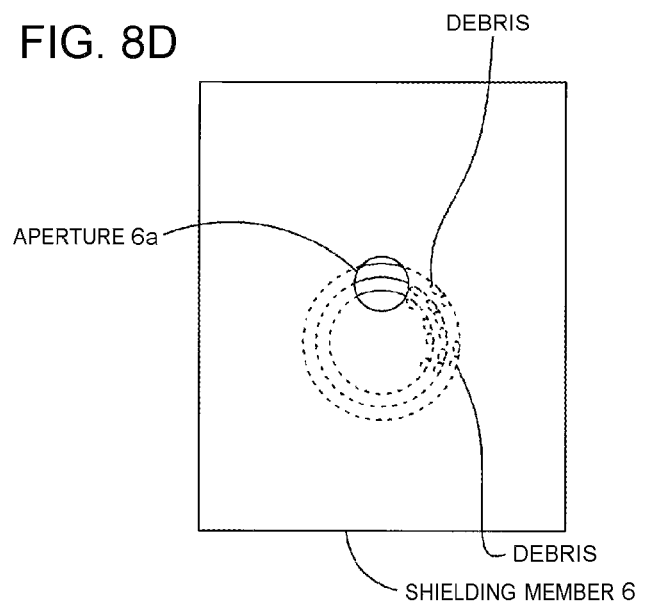
FIG. 8D is a view schematically showing an exemplary configuration according to the revolving motion EUV light condenser mirror observed through an aperture provided in a shielding member in the light source apparatus shown in FIG. 7A.

Similarly, in the revolving motion EUV light condenser mirror 91 at the position shown in FIG. 8C, when the debris adheres to the reflecting plane to some extent, as shown in FIG. 8D, the revolving motion EUV light condenser mirror 91 is again revolved by the above mentioned revolving mechanism until the debris adhering region becomes out of view through the aperture 6a of the shielding member 6, and is then fixed by the fixing mechanism.

As mentioned above, in the EUV light source apparatus which is capable of being used a the inspection apparatus for the mask blank, it is permissible to limit (restrict) the solid angle of the EUV light emitted from the high temperature plasma P with the aperture 6a of the shielding member 6. Thus, according to the present invention, by employing the revolving motion EUV light condenser mirror 91 in which the EUV light condenser mirror 91 is configured to be capable of being revolved, the revolving motion EUV light condenser mirror 91 is revolved and fixed depending on the degree of debris adhesion on the reflecting plane of the revolving motion EUV light condenser mirror 91. Thus, it makes it possible to recover the light reflection rate of the EUV light from being reduced in the revolving motion EUV light condenser mirror 91 due to the debris adhesion. As a result, it makes it possible to supply the EUV light to the inspecting optical system side of the inspection (inspecting) apparatus for the mask blank in a stable manner for a long time of period.

Yet furthermore, according to the present invention, as the rotational type foil trap 4 is used as the debris trap, as mentioned above, the debris incoming through the aperture 6a of the shielding member 6 is dispersed and adheres to the foils 4a of the entire foil trap 4 (as a whole). As a result, it makes it possible to suppress the light transmission rate of the EUV light to be reduced.

In this regard, it is possible to carry out the above mentioned revolving and fixing motions (operations) while maintaining the pressure inside the chamber to be in a lower pressure state (e.g., vacuum state). In other words, it makes it possible to substantially achieve a similar (same) action (effect) as exchanging the EUV light condenser mirror 91 to a new one to which no debris adheres without the vacuum break being entailed. As a result, unlike the conventional EUV light source apparatus, it makes it possible to significantly reduce the down time of the EUV light source apparatus associated with the conventionally necessitated exchange of the EUV light condenser mirror 9.

It should be noted that the case in which the revolving motion EUV light condenser mirror 91 is moved stepwise every time the debris adheres to the reflecting plane to some extent has been described above. However, alternatively, the revolving motion EUV light condenser mirror 91 may be slowly yet continuously revolved. With this configuration, also, the incoming debris is dispersed and adheres to the entire reflecting plane of the EUV light condenser mirror 91 so that it makes it possible to suppress the light transmission rate of the EUV light to be reduced.

Yet furthermore, although, in the above mentioned respective embodiment, the case in which the rotational type foil trap 4 is used has been described, alternatively, the revolving motion stationary type foil trap 5 or otherwise the linear motion stationary type foil trap 51, as shown in the above mentioned embodiments, may be used in place of the rotational type foil trap 4.

Sixth Embodiment

In the above mentioned embodiments shown in FIGS. 7A and 7B, the case in which the rotational type foil trap 4 is provided between the shielding member 6 and the revolving motion EUV light condenser mirror 91 has been described. However, alternatively, the revolving motion stationary type foil trap 5 may be provided in addition to the rotational type foil trap 4.

Figure 9:
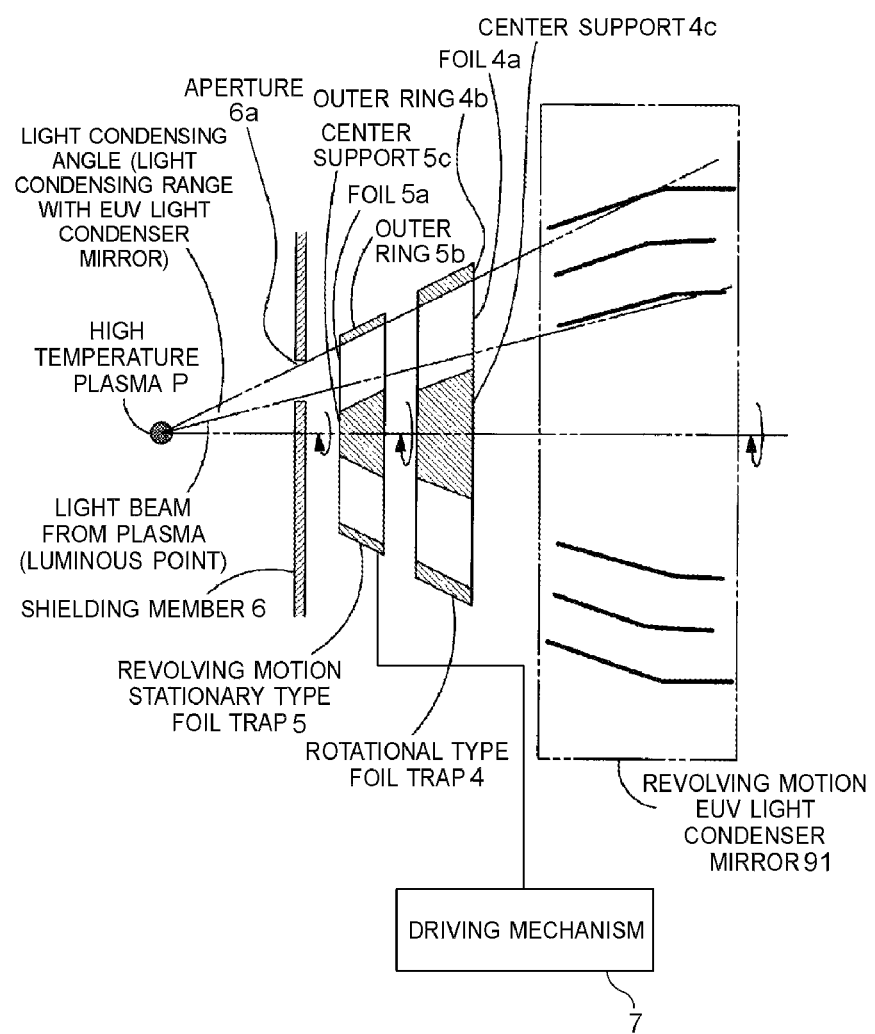
FIG. 9 is a view schematically showing an exemplary configuration according to a sixth embodiment of the present invention in which the revolving motion EUV light condenser mirror is employed and the rotational motion stationary type foil trap and a rotational type foil trap are provided.

FIG. 9 shows a sixth embodiment in which the revolving motion stationary type foil trap 5 and also the rotational type foil trap 4 are provided between the shielding member 6 and the EUV light condenser mirror 91. In other words, FIG. 9 is a sectional view (i.e., sectional view along the light axis of the EUV light) showing an exemplary arrangement of the shielding member 6, the revolving motion stationary type foil trap 5, the rotational type foil trap 4, and the EUV light condenser mirror 91 of the light source apparatus according to the present embodiment.

The revolving motion stationary type foil trap 5 comprises, similarly to those shown in FIG. 1A, foils 5a radially arranged in the radial direction, a center support 5c concentrically arranged and configured to support the plurality of foils 5a, and an outer ring 5b serving as a ring shaped support body. The stationary type foil trap 5 is provided with a driving mechanism 7, and the stationary type foil trap 5 is revolved by the driving mechanism 7 such that the debris adhering portion (region) is deviated from a position of the foil trap facing the aperture 6a of the shielding member 6.

It should be noted that, alternatively, the linear motion stationary type foil trap 51 shown in FIG. 3 may be used in place of the above mentioned revolving motion stationary type foil trap 5.

The debris incoming from the high temperature plasma P through the aperture 6a of the shielding member 6 is, as already mentioned referring to FIG. 5, trapped by the above mentioned revolving motion stationary type foil trap 5. On the other hand, the debris that has not trapped (escaped from being trapped) by the revolving motion stationary type foil trap 5 is then trapped by the rotational type foil trap 4 provided at the subsequent stage, or otherwise deflected such that the travelling (advancing) direction of the debris is different from a direction towards the EUV light condenser mirror 91 (the EUV light condenser mirror 91 side).

Subsequently, the debris that has transmitted (passed through) the rotational type foil trap 4 reaches the rotational type EUV light condenser mirror 91 which is provided at the subsequent stage. Here, it is assumed that, as already described, the above mentioned debris reaches only a part of region on the reflecting plane of the revolving motion EUV light condenser mirror 91, because the above debris has been incoming through the aperture 6a of the shielding member 6. For this reason, even if the debris (Sn) adheres to the revolving motion EUV light condenser mirror 91, still the debris adheres only to a part of region of the reflecting plane thereof.

Taking the above fact into consideration, the debris adhering region on the reflecting plane of the revolving motion EUV light condenser mirror 91 is moved from a position of the reflecting plane facing the aperture 6a of the shielding member 6. Thus, it makes it possible to suppress the light transmission rate of the EUV light to be reduced (or recover the light transmission rate from being reduced) and to make the useful life duration of the EUV light condenser mirror be longer.

According to the present embodiment, as mentioned above, because the revolving motion stationary type foil trap 5 and also the rotational type foil trap 4 are provided, it makes it possible to further reduce the amount of debris reaching the revolving motion EUV light condenser mirror 91 in more efficient manner. Furthermore, because the revolving motion EUV light condenser mirror 91 is employed, by moving the debris adhering region on the reflecting plane of the revolving motion EUV light condenser mirror 91, it makes it possible to suppress the light transmission rate of the EUV light of the revolving motion EUV light condenser mirror 91 to be reduced (or recover the light transmission rate from being reduced), and to make the useful life duration of the EUV light condenser mirror 91 be longer.

Yet furthermore, the revolving motion stationary type foil trap 5 is, as mentioned above, revolved such that the debris adhering portion (region) is deviated from a position of the foil trap facing the aperture 6a of the shielding member 6. Thus, it makes it possible to suppress the light transmission rate of the EUV light to be reduced (or recover the light transmission rate from being reduced), and to make the useful life duration of the revolving motion stationary type foil trap 5 be longer.

Yet furthermore, because the rotational type foil trap 4 is constantly being rotated, the debris incoming through the aperture 6a of the shielding member 6 is dispersed and adheres to the entire foils 4a of the foil trap 4. Thus, similarly to the revolving motion stationary type foil trap 5, it makes it possible to suppress the light transmission rate of the EUV light to be reduced, and to make the life duration of the rotational type foil trap 4 be longer.

Yet furthermore, it is possible to carry out the above mentioned linear motion and fixing motion (operations) while maintain the pressure inside the chamber to be in a lower pressure state (e.g., vacuum state). Thus, unlike the conventional light source apparatus, it makes it possible to significantly reduce the down time of the EVU light source apparatus associated with the conventionally necessitated exchange of the EUV light condenser mirror 9.

It should be noted that, in the exemplary configuration shown in FIG. 9, the revolving motion stationary type foil trap 5 is arranged such that the revolving motion stationary type foil trap 5 is to face the high temperature plasma P through the aperture 6a of the shielding member 6. However, alternatively, as mentioned above, the rotational type foil trap 4 may be arranged such that the rotational type foil trap 4 is to face the high temperature plasma P through the aperture 6a of the shielding member 6, and the revolving motion stationary type foil trap 5 may be arranged at the light emitting side of the rotational type foil trap 4.

Seventh Embodiment

In the above mentioned fifth and sixth embodiments of the EUV light source apparatuses that are capable of being used as inspecting light source for the mask blank, the shielding member 6 having the aperture 6a is arranged between the high temperature plasma P and the debris trap (i.e., the stationary type foil trap 5 and/or the rotational type foil trap 4), and furthermore the revolving motion EUV light condenser mirror 91 is employed in which the oblique incidence type EUV light condenser mirror is configured to be capable of being revolved, the oblique incidence type EUV light condenser mirror having a structure in which a plurality of thin concave mirrors each having a rotary body shape are arranged to be nested at a high accuracy.

However, as long as focusing attention on the characteristic feature that it is permissible to make smaller the etendue of the EUV light emitted from the EUV light source apparatus for inspecting the mask blank and the solid angle of the EUV light emitted from the high temperature plasma P is kept smaller, the configuration of the EUV light condenser mirror may be different from those shown in the third embodiment. The Seventh embodiment of the present invention is a modification to the EUV light condenser mirrors according to the above mentioned fifth and sixth embodiments.

Figure 10B:
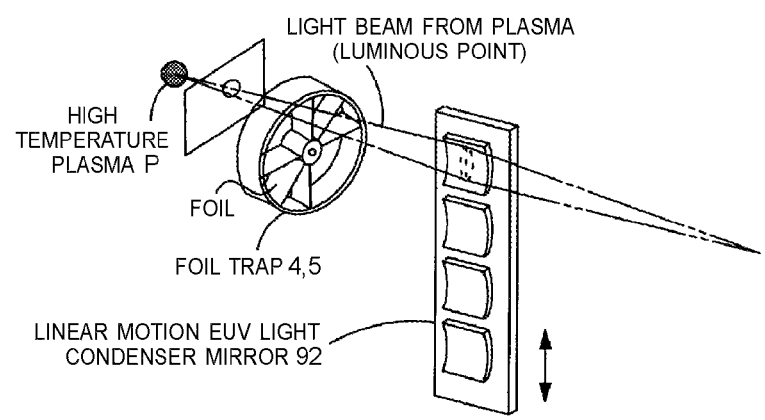
FIG. 10B is a view schematically showing an exemplary configuration according to a seventh embodiment of the present invention in which a linear motion EUV light condenser mirror is employed.

FIGS. 10A and 10B shows the seventh embodiment of the present invention. More particularly, FIG. 10A is a perspective view showing an exemplary arrangement of the light source apparatus according to the present invention comprising a shielding member 6, the debris trap (i.e., the revolving motion stationary type foil trap 5 and the rotational type foil trap 4), and a linear motion EUV light condenser mirror 92. Likewise, FIG. 10B is a perspective view showing an exemplary arrangement of the light source apparatus according to the present invention comprising a high temperature plasma P; the debris trap; and the liner motion EUV light condenser mirror 92. It should be noted that, in FIG. 10B, although only one foil trap constituting the debris trap is shown, this is solely for facilitating understanding and is intended not to limit the particular configuration of the present embodiment.

As shown in FIGS. 10A and 10B, according to the seventh embodiment of the present invention, an EUV light condenser mirror segment assembly (i.e., an assembly or aggregate of segments of the EUV light condenser mirror) 92a is configured (assembled) by cutting out a plurality of segments each including a part on the reflecting plane to which the EUV light reaches (i.e., a region reflecting the EUV light) out of the respective concave mirrors of the oblique incidence type EUV light condenser mirror according to the fifth and sixth embodiments, the oblique incidence type EUV light condenser mirror having a structure in which a plurality of concave mirrors each having a rotary body are arranged to be nested. The present embodiment employs an EUV light condenser mirror 92 having a structure in which a plurality of such EUV light condenser mirror assemblies (aggregates) 92a are arranged in series. Furthermore, the EUV light condenser mirror 92 is provided with a driving mechanism 78, and the EUV light condenser mirror 92 is linearly moved (translated) by the driving mechanism 78 in an alignment direction of the EUV light condenser mirror assemblies 92a (such motion is hereinafter referred to as a "linear motion", and the EUV light condenser mirror according to the present embodiment is also referred to as a "linear motion EUV light condenser mirror" 92).

In order to simply facilitate understanding, in FIGS. 10A and 10B, and also FIGS. 11A to 11D showing a driving condition of the EUV light condenser mirror 92 according to the seventh embodiment, a certain EUV light condenser mirror is shown that has a structure in which a segment including a portion (part) of the reflecting plane to which the EUV light reaches is cut out as a light condenser mirror segment from one piece of concave mirror of the EUV light condenser mirror of the above mentioned embodiments, and a plurality of segments are fixed to a light condenser mirror segment assembly holder in a state that a plurality of segments are arranged in series. However, alternatively, the EUV light condenser mirror 92 may be configured by constituting each of EUV light condenser mirror segment 92a from a plurality of light condenser mirror segments arranged to be nested, and then attaching a plurality of the EUV light condenser mirror segments 92a to a light condenser mirror segment holder 92b.

FIGS. 11A to 11D shows the linear motion EUV light condenser mirror 92 observed from the aperture 6a of the shielding member 6.

It should be noted that the debris trap is omitted in FIGS. 11A to 11D.

Figure 11A:
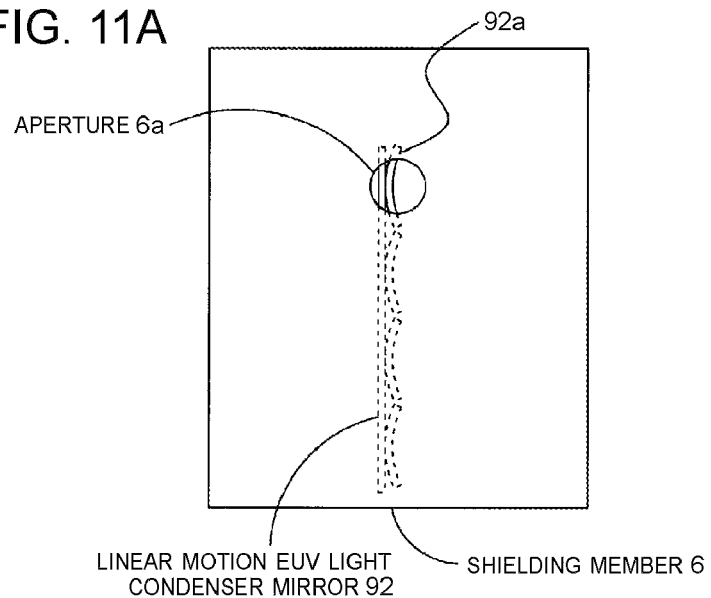
FIG. 11A is a view schematically showing an exemplary configuration according to the linear motion EUV light condenser mirror observed through an aperture provided in a shielding member in the light source apparatus shown in FIG. 10A.

As mentioned above, in the case of the EUV light source apparatus for inspecting the mask blank, it is permissible to make smaller the solid angle of the EUV light emitted from the high temperature plasma P. Thus, as shown in FIG. 11A, the EUV light flux entering (incident) from the aperture 6a of the shielding member 6 is assumed to be entirely reflected on the reflecting plane of the segment 92a (i.e., the light condenser mirror assembly) of the linear motion EUV light condenser mirror 92.

Figure 11B:
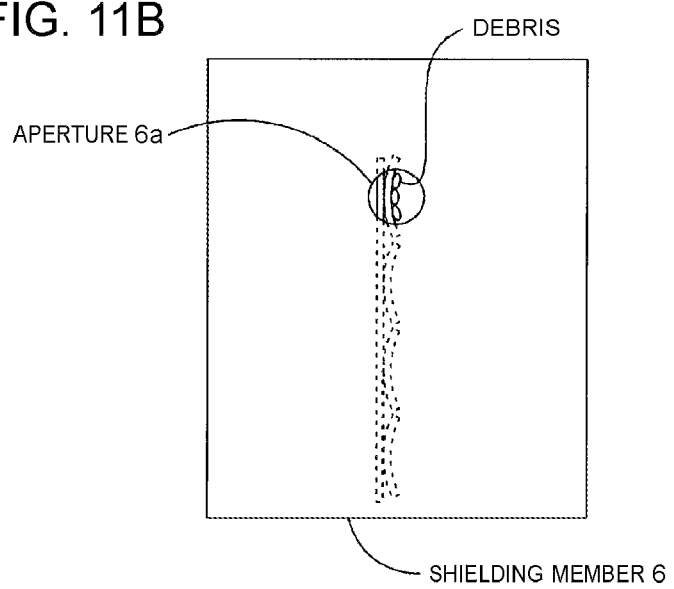
FIG. 11B is a view schematically showing an exemplary configuration according to the linear motion EUV light condenser mirror observed through an aperture provided in a shielding member in the light source apparatus shown in FIG. 10A.

Likewise, the debris emitted from the high temperature plasma P (i.e., a Sn ion or a neutral Sn atom travelling at a high speed) is also assumed to reach at least a part of region on the reflecting plane of the EUV light condenser mirror segment 92a. Thus, even if the debris (Sn) adheres to the reflecting plane of the segment 92a of the EUV light condenser mirror 92, as shown in FIG. 11B, the adhesion region of Sn is no more than at least a part of the reflecting planes of a plurality of EUV light condenser mirror segments 92a constituting the EUV light condenser mirror 92 according to the seventh embodiment.

Figure 11C:
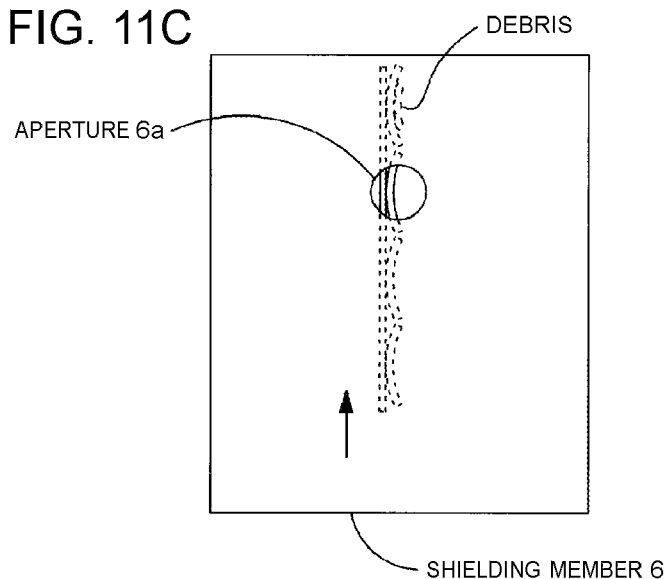
FIG. 11C is a view schematically showing an exemplary configuration according to the linear motion EUV light condenser mirror observed through an aperture provided in a shielding member in the light source apparatus shown in FIG. 10A.

Accordingly, by employing the linear motion EUV light condenser mirror 92 in which the EUV light condenser mirror having such structure is configured to be capable of being revolved, it makes it possible to move the debris adhering region of the linear motion EUV light condenser mirror 92 from the position of the light condenser mirror facing the aperture 6a of the shielding member 6. In other words, as shown in FIG. 11C, the linear motion EUV light condenser mirror 92 is linearly moved and positioned by the driving mechanism 78 until an EUV light condenser mirror segment adjacent to the EUV light condenser mirror segment 92a to which the debris adheres is positioned at a position facing the aperture 6a of the shielding member 6. Subsequently, the linear motion EUV light condenser mirror 92 is fixed by the fixing mechanism, which is not shown in the drawings.

Figure 11D:
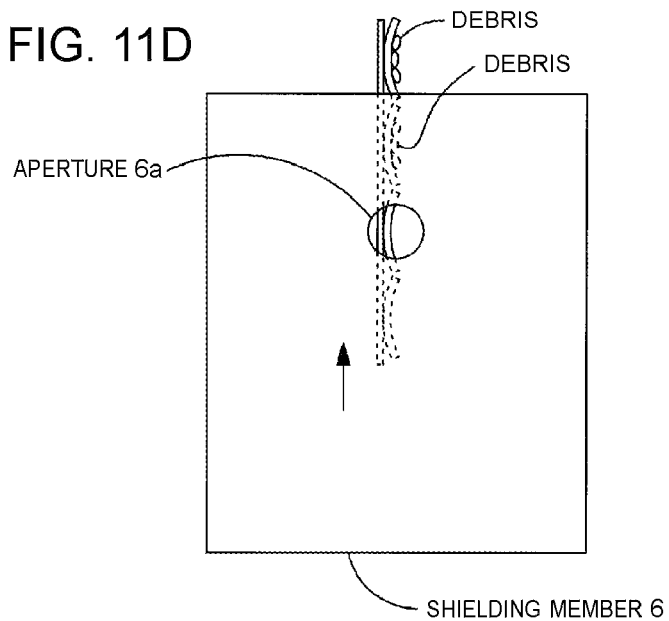
FIG. 11D is a view schematically showing an exemplary configuration according to the linear motion EUV light condenser mirror observed through an aperture provided in a shielding member in the light source apparatus shown in FIG. 10A.
Figure 12:
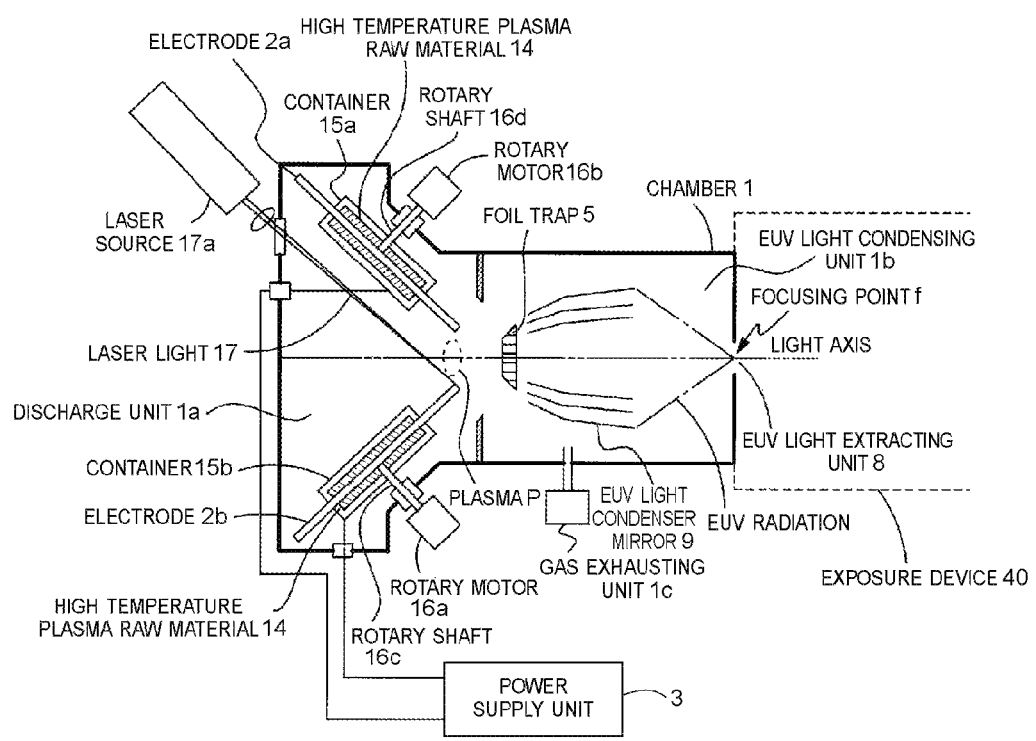
FIG. 12 is a view schematically showing an EUV light source apparatus of the DPP type in a simplified manner.
Figure 13:
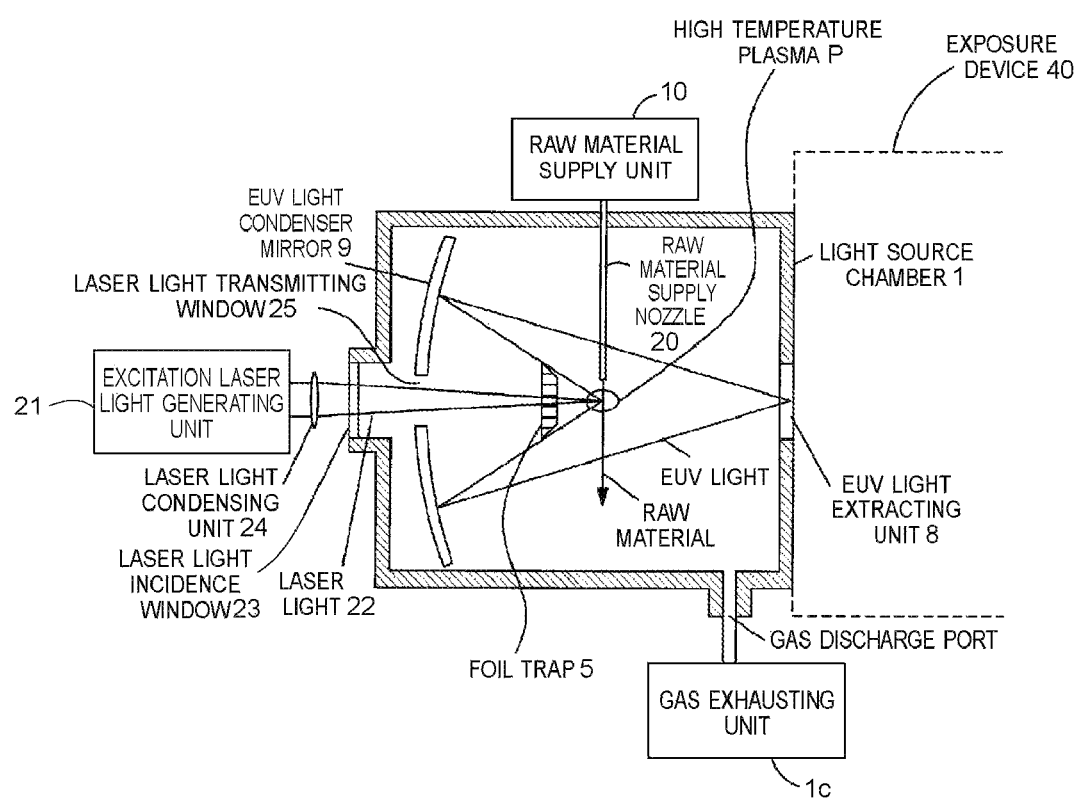
FIG. 13 is a view schematically showing the EUV light source apparatus of the LPP type in a simplified manner.

Similarly, in the linear motion EUV light condenser mirror 92 at a position shown in FIG. 11C, when the debris adheres to some extent to the reflecting plane of the EUV light condenser mirror segment 92a, which is already moved and positioned, then, as shown in FIG. 11D, the linear motion EUV light condenser mirror 92 is linearly moved by the driving mechanism 78 until another EUV light condenser mirror segment further adjacent to the EUV light condenser mirror segment 92a to which the debris adheres is positioned at a position facing the aperture 6a of the shielding member 6. Subsequently, the linear motion EUV light condenser mirror 92 is fixed by the fixing mechanism.

As mentioned above, according to the seventh embodiment, the EUV light condenser mirror segment assembly (aggregate) is configured by, out of the respective concave mirrors of the above mentioned oblique incidence type EUV light condenser mirror 9, cutting out a plurality of segments each including a part on the reflecting plane to which the EUV light reaches (i.e., a region reflecting the EUV light) to constitute the EUV light condenser mirror segment assembly (aggregate). The present invention employs the linear motion EUV light condenser mirror 92 having a structure in which a plurality of EUV light condenser mirror segment assemblies 92a are arranged in series to constitute the EUV light condenser mirror, and the EUV light condenser mirror is configured to be capable of being linearly moved (translated).

With so configured structure, it is possible to linearly move (translate) and fix the linear motion EUV light condenser mirror 92 depending on a degree of debris adhesion to the EUV light condenser mirror segment assembly. Thus, it makes it possible to recover the light transmission rate of the EUV light from being reduced in the linear motion EUV light condenser mirror 92 due to the debris adhesion.

As a result, it makes it possible to achieve a longer useful life duration of the linear motion EUV light condenser mirror 92, and also to supply the EUV light to the inspecting optical system side of the inspecting apparatus for the mask blank in a stable manner for a long time of period.

Yet furthermore, similarly to the above mentioned fifth and sixth embodiments, it is possible to carry out the above mentioned linear motion and fixing motion (operations) of the linear motion EUV light condenser mirror while maintain the pressure inside the chamber to be in a lower pressure state (e.g., vacuum state). As a result, unlike the conventional light source apparatus, it makes it possible to significantly reduce the down time of the EUV light source apparatus associated with the conventionally necessitated exchange of the EUV light condenser mirror 9.

It should be noted that, in the above mentioned fifth to seventh embodiments, although certain cases in which the rotational type foil trap 4 is solely used, or otherwise the revolving motion stationary type foil trap 5 and the rotational type foil trap 4 are used have been described, alternatively, the revolving motion stationary type foil rap 5, or the linear motion stationary type foil trap 51, may be solely provided.

While certain embodiments have been described, these embodiments have been presented by way of example only, and are not intended to limit the scope of the present invention. The novel apparatuses and methods thereof described herein may be embodied in a variety of other forms. Furthermore, various omissions, substitutions and modifications in the form of the apparatuses and methods thereof described herein may be made without departing from the gist of the present invention. The accompanying claims and their equivalents are intended to cover such forms or modifications as would fall within the scope and gist of the present invention.

The present application is based upon and claims the benefit of a priority from Japanese Patent Application No. 2013-266669, filed on Dec. 25, 2013, and the entire contents of which are incorporated herein by reference.

REFERENCE SIGNS LIST

1 Chamber
1a Discharge Unit
1b EUV Light Condensing Unit
1c Gas Exhausting Unit
2a, 2b Discharge Electrodes
3 Power Supply Unit
4 Rotational Type Foil Trap
4a Foil
4b Outer Ring
4c Center Support
51 Linear Motion Stationary Type Foil Trap
51a Foils
51b Fixing Frame
5 Stationary Type Foil Trap
5a Foils
5b Outer Ring
5c Center Support
6 Shielding Member
7, 71, 78, 79 Driving Mechanism
6a Aperture
8 EUV Light Extracting Unit
9 EUV Light Condenser Mirror
91 Revolving Motion EUV Light Condenser Mirror
92 Linear Motion EUV Light Condenser Mirror
92a EUV Light Condenser Mirror Aggregate (Segment)
10 Raw Material Supply Unit
11 Foil Trap Cover
14 High Temperature Plasma Raw Material
15 Container
16a, 16b Rotary Motor
16c, 16d Rotary Driving Shaft
17 Laser Light
17a Laser Source
20 Raw Material Supply Nozzle
22 Laser Light
21 Excitation Laser Light Generating Device
22 Laser Light (Laser Beam)
23 Laser Light Incidence Window
24 Laser Light Condensing Unit
40 Exposure Device
P High Temperature Plasma

What is claimed is:

1. A light source apparatus, comprising:
a vessel;
a debris trap configured to trap at least a part of debris from a plasma, the plasma emitting light and being generated in the vessel;
a light condenser mirror arranged at a light emitting side of the debris trap; and
a shielding member arranged between the plasma and the debris trap, the shielding member having an aperture configured to limit a solid angle of the light such that an irradiation area of the light emitted from the plasma becomes smaller than an aperture of the debris trap at a side of the plasma,
the debris trap being provided with a driving mechanism configured to drive the debris trap such that a part of the debris trap to which the debris adheres is deviated from a position of the debris trap facing the aperture.

2. The light source apparatus according to claim 1, wherein the debris trap comprises a plurality of foils radially extending; and at least one foil trap configured to allow the light to pass through but to trap the debris from the plasma, and a driving motion to drive the foil trap is a revolving motion.

3. The light source apparatus according to claim 2, wherein the light condenser mirror is provided with a driving mechanism configured to drive the light condenser mirror such that a part of the light condenser mirror to which the debris adheres is deviated from a position of the light condenser mirror facing the aperture.

4. The light source apparatus according to claim 3, wherein the light condenser mirror is an oblique incidence type light condenser mirror having a structure in which a plurality of concave mirrors each having a rotary body shape are arranged to be nested, and
a driving motion to drive the light condenser mirror is a revolving motion.

5. The light source apparatus according to claim 3, wherein the light condenser mirror has a structure in which a plurality of light condenser mirror segment assemblies are arranged in series, each of the light condenser mirror segment assemblies being configured by cutting out, from an oblique incidence type light condenser mirror, a plurality of segments each including a region to reflect the EUV light, the oblique incidence type light condenser mirror having a structure in which a plurality of concave mirrors each having a rotary body shape are arranged to be nested, and
a driving motion to drive the EUV light condenser mirror is a linear motion.

6. The light source apparatus according to claim 2, wherein the shielding member is made of molybdenum or tungsten.

7. The light source apparatus according to claim 1, wherein the debris trap comprises a plurality of foils arranged substantially in parallel at a predetermined interval; and at least one foil trap configured to allow the light to pass through but to trap the debris from the plasma, and
a driving motion to drive the foil trap is a linear motion.

8. The light source apparatus according to claim 7, wherein the light condenser mirror is provided with a driving mechanism configured to drive the light condenser mirror such that a part of the light condenser mirror to which the debris adheres is deviated from a position of the light condenser mirror facing the aperture.

9. The light source apparatus according to claim 8, wherein the light condenser mirror is an oblique incidence type light condenser mirror having a structure in which a plurality of concave mirrors each having a rotary body shape are arranged to be nested, and
a driving motion to drive the light condenser mirror is a revolving motion.

10. The light source apparatus according to claim 8, wherein the light condenser mirror has a structure in which a plurality of light condenser mirror segment assemblies are arranged in series, each of the light condenser mirror segment assemblies being configured by cutting out, from an oblique incidence type light condenser mirror, a plurality of segments each including a region to reflect the EUV light, the oblique incidence type light condenser mirror having a structure in which a plurality of concave mirrors each having a rotary body shape are arranged to be nested, and
a driving motion to drive the EUV light condenser mirror is a linear motion.

11. The light source apparatus according to claim 7, wherein the shielding member is made of molybdenum or tungsten.

12. The light source apparatus according to claim 1, wherein the light condenser mirror is provided with a driving mechanism configured to drive the light condenser mirror such that a part of the light condenser mirror to which the debris adheres is deviated from a position of the light condenser mirror facing the aperture.

13. The light source apparatus according to claim 12, wherein the light condenser mirror is an oblique incidence type light condenser mirror having a structure in which a plurality of concave mirrors each having a rotary body shape are arranged to be nested, and
   a driving motion to drive the light condenser mirror is a revolving motion.

14. The light source apparatus according to claim 13, wherein the shielding member is made of molybdenum or tungsten.

15. The light source apparatus according to claim 12, wherein the light condenser mirror has a structure in which a plurality of light condenser mirror segment assemblies are arranged in series, each of the light condenser mirror segment assemblies being configured by cutting out, from an oblique incidence type light condenser mirror, a plurality of segments each including a region to reflect the EUV light, the oblique incidence type light condenser mirror having a structure in which a plurality of concave mirrors each having a rotary body shape are arranged to be nested, and
   a driving motion to drive the EUV light condenser mirror is a linear motion.

16. The light source apparatus according to claim 15, wherein the shielding member is made of molybdenum or tungsten.

17. The light source apparatus according to claim 12, wherein the shielding member is made of molybdenum or tungsten.

18. The light source apparatus according to claim 1, wherein the shielding member is made of molybdenum or tungsten.

* * * * *